(12) United States Patent
Li et al.

(10) Patent No.: US 12,051,756 B2
(45) Date of Patent: Jul. 30, 2024

(54) FLASH MEMORY DEVICE AND METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jiun-Yun Li, Taipei (TW); Nai-Wen Hsu, Pingtung County (TW); Wei-Chih Hou, Taichung (TW); Yu-Jui Wu, Taipei (TW); Yen Chuang, Kaohsiung (TW); Chia-Yu Liu, Taoyuan (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 198 days.

(21) Appl. No.: 17/575,054

(22) Filed: Jan. 13, 2022

(65) Prior Publication Data
US 2023/0020015 A1 Jan. 19, 2023

Related U.S. Application Data

(60) Provisional application No. 63/222,642, filed on Jul. 16, 2021.

(51) Int. Cl.
*G11C 16/04* (2006.01)
*G11C 16/10* (2006.01)
(Continued)

(52) U.S. Cl.
CPC ........ *H01L 29/792* (2013.01); *G11C 16/0466* (2013.01); *G11C 16/10* (2013.01);
(Continued)

(58) Field of Classification Search
CPC ... H01L 29/792; H01L 29/155; H01L 29/161; G11C 16/0466; G11C 16/10; G11C 16/14; G11C 16/26
(Continued)

(56) References Cited

U.S. PATENT DOCUMENTS 6,498,360 B1 * 12/2002 Jain ...................... H01L 29/775
438/285
8,860,160 B2 * 10/2014 Cheng .................... H10B 10/00
257/427

(Continued)

OTHER PUBLICATIONS

Chou et al., "Temperature dependence of DC transport characteristics for a two-dimensional electron gas in an undoped Si/SiGe heterostructure," Appl. Phys. Lett., vol. 112, Article No. 083502, Feb. 21, 2018, total 5 pages.
(Continued)

*Primary Examiner* — Ly D Pham
(74) *Attorney, Agent, or Firm* — Birch, Stewart, Kolasch & Birch, LLP

(57) ABSTRACT

A flash memory device includes a substrate, a semiconductor quantum well layer, a semiconductor spacer, a semiconductor channel layer, a gate structure, and source/drain regions. The semiconductor quantum well layer is formed of a first semiconductor material and is disposed over the substrate. The semiconductor spacer is formed of a second semiconductor material and is disposed over the first semiconductor channel layer. The semiconductor channel layer is formed of the first semiconductor material and is disposed over the semiconductor spacer. Thea gate structure is over the second semiconductor channel layer. The source/drain regions are over the substrate and are on opposite sides of the gate structure.

20 Claims, 22 Drawing Sheets

(51) Int. Cl.
  *G11C 16/14* (2006.01)
  *G11C 16/26* (2006.01)
  *H01L 29/15* (2006.01)
  *H01L 29/161* (2006.01)
  *H01L 29/792* (2006.01)

(52) U.S. Cl.
  CPC .............. *G11C 16/14* (2013.01); *G11C 16/26* (2013.01); *H01L 29/155* (2013.01); *H01L 29/161* (2013.01)

(58) Field of Classification Search
  USPC .................................................... 365/185.18
  See application file for complete search history.

(56) References Cited

U.S. PATENT DOCUMENTS

| | | | | |
|---|---|---|---|---|
| 2005/0219912 | A1* | 10/2005 | Gendrier | H10B 41/30 257/E29.302 |
| 2006/0131621 | A1* | 6/2006 | Shin | H01L 29/7839 257/280 |
| 2014/0120666 | A1* | 5/2014 | Haensch | H01L 21/823814 257/E21.409 |
| 2016/0365476 | A1* | 12/2016 | Taylor | H01L 33/0041 |

OTHER PUBLICATIONS

Fang et al., "Low-Temperature Characteristics of $HfO_x$-Based Resistive Random Access Memory," IEEE Electron Device Letters, vol. 36, No. 6, Jun. 2015, pp. 567-569.

Ihmig et al., "Batch screening of commercial serial flash-memory integrated circuits for low-temperature applications," Cryogenics, vol. 71, May 23, 2015, pp. 39-46.

Li et al., "A crossbar network for silicon quantum dot qubits," Science Advances, Jul. 6, 2018, total 10 pages.

Su et al., "Effects of surface tunneling of two-dimensional hole gases in undoped Ge/GeSi heterostructures," Physical Review Materials, vol. 1, Article No. 044601, Sep. 14, 2017, total 6 pages.

Su et al., "Electron mobility enhancement in an undoped Si/SiGe heterostructure by remote carrier screening," J. Appl. Phys., vol. 125, Article No. 235705, Jun. 17, 2019, total 10 pages.

Van Duzer et al., "64-kb Hybrid Josephson-CMOS 4 Kelvin RAM With 400 ps Access Time and 12 mW Read Power," IEEE Transactions on Applied Superconductivity, vol. 23, No. 3, Article No. 1700504, Nov. 29, 2012, total 5 pages.

Veldhorst et al., "Silicon CMOS architecture for a spin-based quantum computer," Nature Communications, vol. 8, Article No. 1766 (2017), Dec. 15, 2017, total 9 pages.

Wang et al., "DRAM Retention at Cryogenic Temperatures," 2018 IEEE International Memory Workshop (IMW), Kyoto, Japan, May 16-18, 2018, total 5 pages.

* cited by examiner

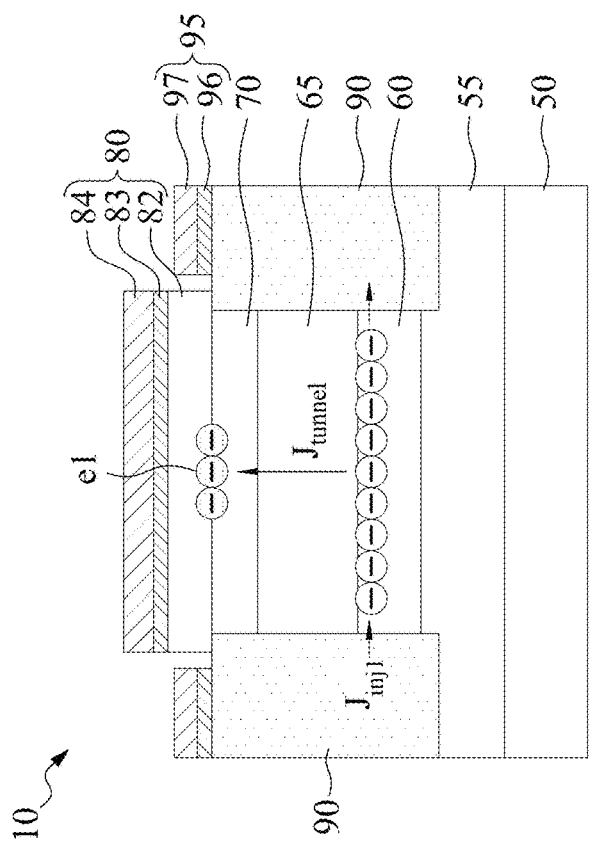
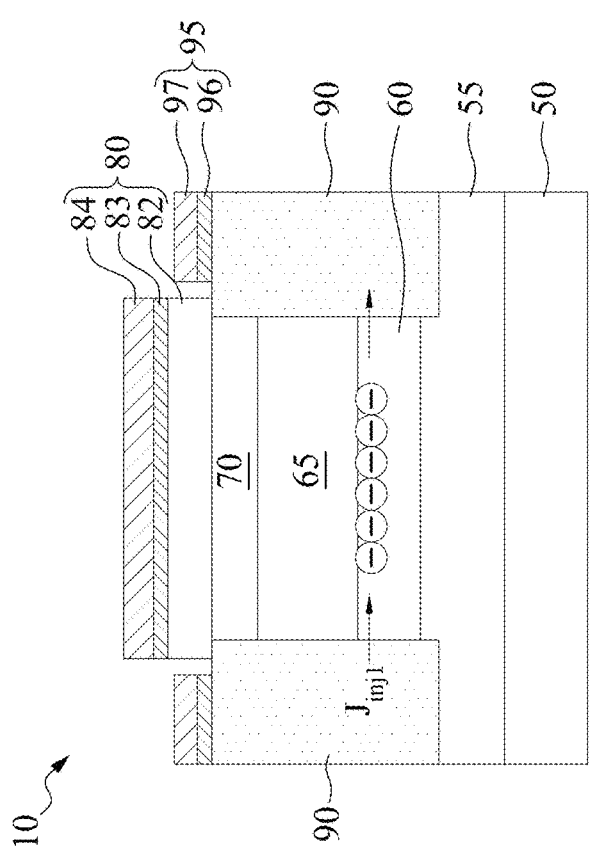
Fig. 3A
Fig. 3B

FLASH MEMORY DEVICE AND METHOD THEREOF

PRIORITY CLAIM AND CROSS-REFERENCE

The present application claims priority to U.S. Provisional Application Ser. No. 63/222,642, filed. Jul. 16, 2021, which is herein incorporated by reference.

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C, and 3D illustrate current conduction mechanism at different stages in accordance with some embodiments of the present disclosure.

DETAILED DESCRIPTION

Figure 1:
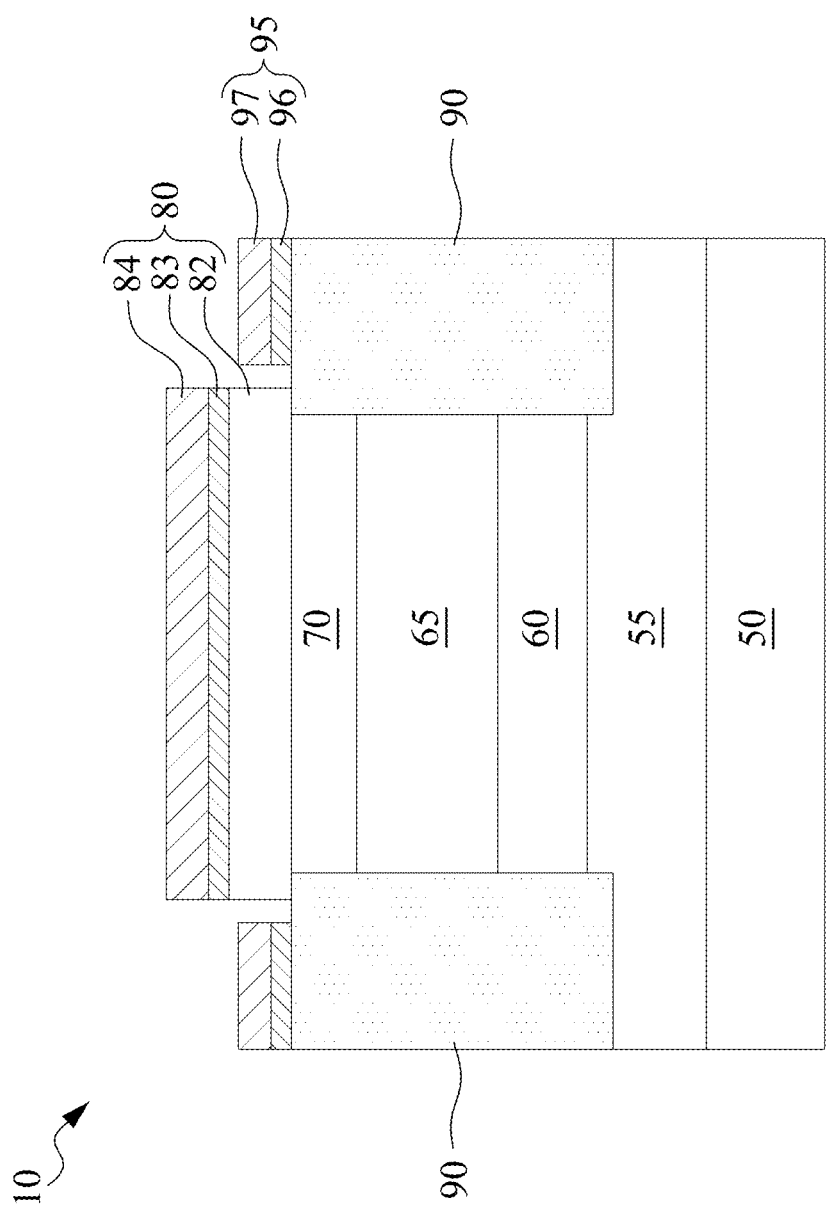
FIG. 1 is a cross-sectional view of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a memory device in accordance with some embodiments. Shown there is a device 10. The device 10 includes a semiconductor substrate 50 in which electronic components may be formed on, in accordance with some embodiments. Generally, the substrate 50 illustrated in FIG. 1 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}$ As, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. For example, the semiconductor substrate 50 may be a silicon substrate doped with p-type dopants, such as boron (B), and the dopant concentration may be in a range from about $1\times10^{15}$ to about $1\times10^{17}$ to form a lightly doped p-type silicon substrate. Other substrates that may be used include multi-layered substrates, gradient substrates, or hybrid orientation substrates.

A strain relaxed buffer layer 55 is disposed over the semiconductor substrate 50. For example, the strain relaxed buffer layer 55 may include silicon germanium (SiGe), and may also be referred to as a SiGe relaxed buffer layer. In some embodiments, the silicon germanium layer may include composition $Si_{(1-x)}Ge_x$ where x is a number ranging from 0 to 1, indicating the atomic percentage of germanium. In some embodiments, the silicon germanium layer may include composition of $Si_{0.85}Ge_{0.15}$. In some other embodiments, the silicon germanium layer may include composition of $Si_{0.7}Ge_{0.3}$. In some other embodiments, the silicon germanium layer may include composition of $Si_{0.6}Ge_{0.4}$. In some embodiment, the silicon germanium layer may include composition of $Si_{0.84}Ge_{0.16}$. In some embodiments, the strain relaxed buffer layer 55 is un-doped. The SiGe relaxed buffer layer (e.g., the strain relaxed buffer layer 55) on a Si substrate (e.g., the semiconductor substrate 50) can have a thin layer of Si (e.g., the semiconductor layer 60) deposited on them, creating tension in the thin Si layer. Tensile Si layer have advantageous properties for the basic device in integrated circuits. For example, placing Si in tension increases the mobility of electrons moving parallel to the surface of the semiconductor substrate 50, thus increasing the frequency of operation of the device and the associated circuit. Second, the band offset between the relaxed SiGe and the tensile Si will confine electrons in the Si layer.

A semiconductor layer 60 is disposed over the strain relaxed buffer layer 55. In some embodiments, the semiconductor layer 60 is made of silicon (Si), and may also be referred to as a silicon layer. As a result of being epitaxially grown on the SiGe strain relaxed buffer layer 55, the strained semiconductor layer 60 has the advantage of tensile longitudinal stress, and will serve as a channel layer in the device. In some embodiments, as the semiconductor layer 60 will be buried between the strain relaxed buffer layer 55 and a semiconductor spacer 65, the semiconductor layer 60 can also be referred to as a buried channel layer. In some embodiments, the semiconductor layer 60 is un-doped.

In some embodiments, the thickness of the semiconductor layer 60 depends on the Ge friction in the strain relaxed buffer layer 55. For example, when the Ge percentage of the strain relaxed buffer layer 55 is 15% (e.g., $Si_{0.85}Ge_{0.15}$), the thickness of the semiconductor layer 60 is in a range from about 18 nm to about 22 nm, such as 20 nm. When the Ge percentage of the strain relaxed buffer layer 55 is 30% (e.g., $Si_{0.7}Ge_{0.3}$), the thickness of the semiconductor layer 60 is in a range from about 8 nm to about 12 nm, such as 10 nm. When the Ge percentage of the strain relaxed buffer layer 55 is 40% (e.g., $Si_{0.6}Ge_{0.4}$), the thickness of the semiconductor layer 60 is in a range from about 4 nm to about 8 nm, such as 6 nm.

A semiconductor spacer 65 is disposed over the semiconductor layer 60. In some embodiments, the semiconductor spacer 65 may include silicon germanium (SiGe), and may also be referred to as a SiGe spacer. In some embodiments, the semiconductor spacer 65 is a strain relaxed layer. In some embodiments, the silicon germanium layer may include composition $Si_{(1-x)}Ge_x$ where x is a number ranging from 0 to 1, indicating the atomic percentage of germanium. In some embodiments, the germanium concentration of the semiconductor spacer 65 may be lower than the germanium concentration of the strain relaxed buffer layer 55. In some embodiments, the germanium concentration of the semiconductor spacer 65 may be substantially equal to the germanium concentration of the strain relaxed buffer layer 55, such as about 16% (e.g., $Si_{0.84}Ge_{0.16}$). In some embodiments, the semiconductor spacer 65 is un-doped. In some embodiments, the thickness of the semiconductor spacer 65 is in a range from about 25 nm to bout 100 nm. In some embodiments, the semiconductor spacer 65 is thicker than the semiconductor layer 60. In some embodiments, the Si layer 60 is sandwiched between the SiGe relaxed buffer layer 55 and the SiGe spacer 65. Because the conduction band energy of the Si layer 60 is lower than the conduction band energy of the SiGe relaxed buffer layer 55 and the conduction band energy of the SiGe spacer 65, a quantum well is created in the Si layer 60 where carriers (electrons or holes) can be confined in a two-dimension region. Accordingly, the Si layer 60 can also be referred to as a Si quantum well.

A semiconductor layer 70 is disposed over the semiconductor spacer 65. In some embodiments, the semiconductor layer 70 is made of silicon (Si), and may be referred to as a semiconductor layer 70. In some embodiments, the semiconductor layer 70 may also serve as a channel layer in the device. In some embodiments, because the semiconductor layer 70 is a surface layer of the stack of layers 55, 60, 65, and 70, and thus the semiconductor layer 70 can also be referred to as a surface channel layer. In some embodiments, the semiconductor layer 70 is un-doped. In some embodiments, the semiconductor layer 70 is un-doped. In some embodiments, the thickness of the semiconductor layer 70 is in a range from about 3 nm to about 4 nm. In some embodiments, the semiconductor layer 70 is thinner than the semiconductor layer 60.

A gate structure 80 is disposed over the semiconductor layer 70. The gate structure 80 may include a gate dielectric 82, an adhesion metal 83 over the gate dielectric 82, and a gate electrode 84 over the adhesion metal 83. The gate dielectric 82 includes, for example, an oxide, such as silicon oxide ($SiO_2$), aluminum oxide ($Al_2O_3$). In some other embodiments, the gate dielectric 82 may include a high-k dielectric material such as oxides of metals (e.g., oxides of Al, Zr, La, Mg, Ba, Ti, and other metals), and the like, or combinations thereof, or multilayers thereof. The adhesion metal 83 may include Ti, Cr, or other suitable adhesion metals. The gate electrode 84 may include Al, Cu, Ag, Au, W, or other suitable gate electrode materials. In some embodiments, the adhesion metal 83 may be made of Ti and the gate electrode 84 is made of Au. The thickness of the adhesion metal 83 is in a range from about 5 nm to about 10 nm, and the thickness of the gate electrode 84 is in a range from about 75 nm to about 150 nm.

Source/drain regions 90 are disposed over the substrate 50 and on opposite sides of the gate structure 80. In some embodiments, the source/drain regions 90 may be doped regions extending in the strain relaxed buffer layer 55, the semiconductor layer 60, the semiconductor spacer 65, and the semiconductor layer 70. The dopants of the source/drain regions 90 may be n-type dopants such as phosphorus (P), and the dopant concentration may be in a range from about $1\times10^{19}$ to about $5\times10^{20}$.

Therefore, the device 10 of FIG. 1 is an n-type device Source/drain contacts 95 are disposed over the source/drain regions 90, respectively. In some embodiments, each of the source/drain contacts 95 may include an adhesion metal 96 and a contact electrode 97 over the adhesion metal 96. The adhesion metal 96 may include Ti, Cr, or other suitable adhesion metals. The contact electrode 97 may include Al, Cu, Ag, Au, W, or other suitable electrode materials. In some embodiments, the adhesion metal 96 may be made of Ti, and the contact electrode 97 is made of Au. The thickness of the adhesion metal 96 is in a range from about 5 nm to about 10 nm, and the thickness of the contact electrode 97 is in a range from about 75 nm to about 150 nm.

Figure 2:
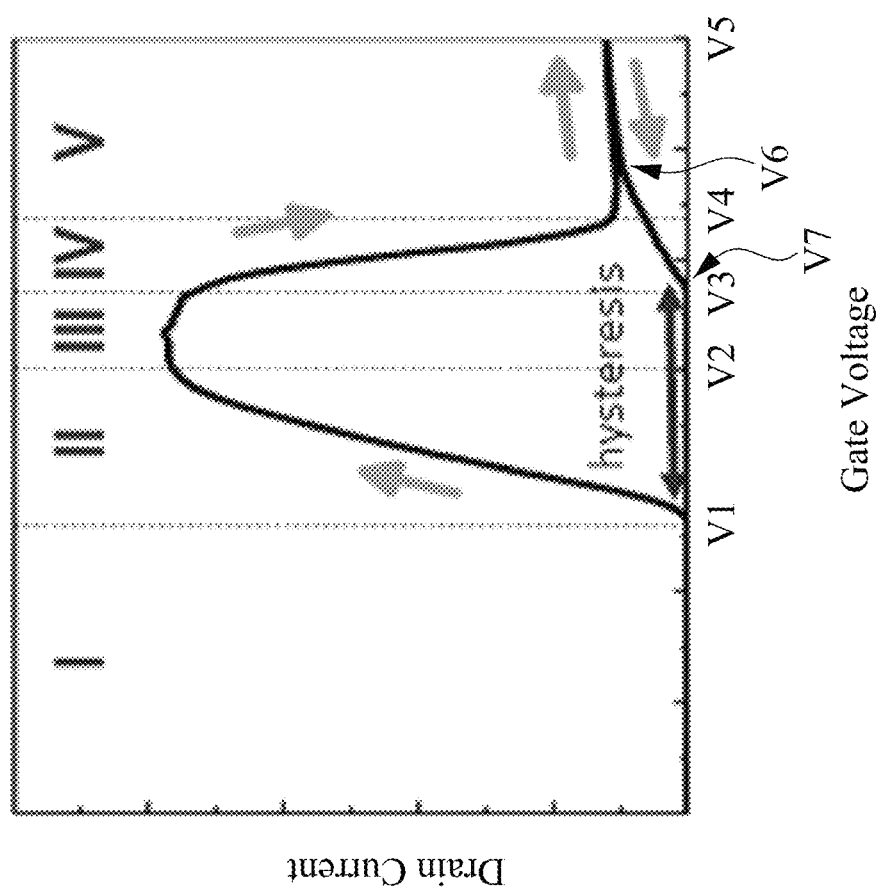
FIG. 2 is a drain current versus gate voltage diagram in accordance with some embodiments of the present disclosure.

FIG. 2 is a drain current versus gate voltage diagram of the memory device of FIG. 1 in accordance with some embodiments of the present disclosure. FIGS. 3A, 3B, 3C, and 3D illustrate current conduction mechanism at different stages of FIG. 2 in accordance with some embodiments of the present disclosure. FIG. 2 illustrates five stages of current conduction. Stage I is gate voltage is lower than V1, stage II is gate voltage between V1 and V2, stage III is gate voltage between V2 and V3, stage IV is gate voltage between V3 and V4, and stage V is gate voltage greater than V4.

In FIG. 2, at stage I where the voltage is lower than V1, there are no carriers in the channels, and the device is turned off.

Reference is made to FIGS. 2 and 3A. The device is turned on when the gate voltage is increased to a value greater than V1, the current flows into the semiconductor layer 60 and increases linearly as the gate voltage increases to V2 as denoted by which is characteristic of transistor operation as shown in stage II of FIG. 2. At stage II, current conduction is happening in the semiconductor layer 60 instead of in the semiconductor layer 70. This is because the gate dielectric 82 may form a poor oxide interface (e.g., defects) with the semiconductor layer 70, and the strong scattering at the poor oxide interface makes carrier mobility in the surface channel (e.g., the semiconductor layer 70) extremely low. Accordingly, the carrier mobility is much higher in the semiconductor layer 60 than in the semiconductor layer 70. Thus, the semiconductor layer 70 is insulating and the current is injected from the source to the semiconductor layer 60 and is collected by the drain.

Reference is made to FIGS. 2 and 3B. When the gate voltage is increased from V2 to V3, the current is substantially saturated, as shown in stage III of FIG. 2. This is unlike the saturation behavior of a transistor due to the channel pinch-off at the drain end with a large drain bias since a very small drain-to-source bias was applied in this work. The current does not change with the gate voltage, which may be due to the saturation of carrier density in the semiconductor layer 60. This may be resulted from a surface tunneling mechanism. As the gate voltage increases, more electrons are injected into the semiconductor layer 60. Thus, the electric field along the gate direction is also increased to cause band bending, enabling effective tunneling of carriers in the semiconductor layer 60 to the semiconductor layer 70, as denoted by "$J_{tunnel}$", That is, carriers may tunnel from the semiconductor layer 60, through the semiconductor spacer 65, to the semiconductor layer 70. The tunneled electrons e1 are then trapped by the defects at the oxide interface between the semiconductor layer 70 and the gate dielectric 82. Once the balance between the surface tunneling from the semiconductor layer 60 and the carrier injection from the source to the semiconductor layer 60 is established, the electron density will not be increased with the gate voltage. As a result, with a constant carrier density in the semiconductor layer 60, the mobility is pinned and the current remains constant, which results in the saturated current in stage III.

Figure 3C:
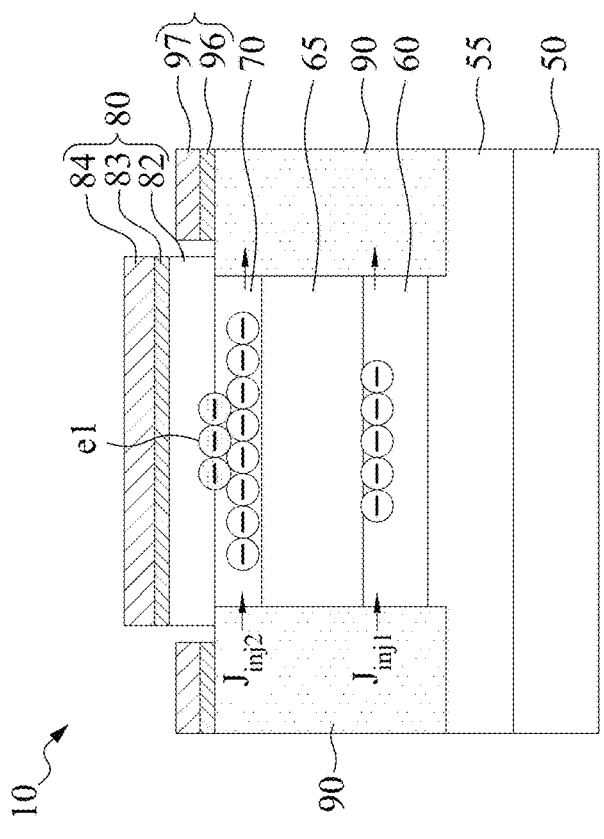

Reference is made to FIGS. 2 and 3C. As the gate voltage is increased from V3 to V4, the drain current starts to decrease, as shown in stage IV of FIG. 2. This may be resulted from the carrier loss in the semiconductor layer 60.

The electrons e1 tunneled from the semiconductor layer 60 to the semiconductor layer 70 are trapped by the oxide interface defects at the gate dielectric 82. The poor oxide interface may include potential fluctuations, which result in poor mobility in the semiconductor layer 70. However, the trapped electrons e1 at the oxide interface may smoothen the potential fluctuations, effectively passivate the poor oxide interface, and therefore enhance the mobility in the semiconductor layer 70. As a result, the source electrons can then be injected into the semiconductor layer 70 as denoted by "$J_{inj2}$", forming an additional conduction path. Meanwhile, since more electrons are populated in the semiconductor layer 70, the gate electric field in the heterostructure will be decreased such that the surface tunneling in the semiconductor layer 60 is reduced. Thus, the electron density in the semiconductor layer 60 is also reduced and the current conduction in the semiconductor layer 60 becomes smaller. On the other hand, the effect of conduction enhancement by the presence of the semiconductor layer 70 is fairly weak due to the much lower channel mobility, so the drain current decreases with the gate voltage.

Figure 3D:
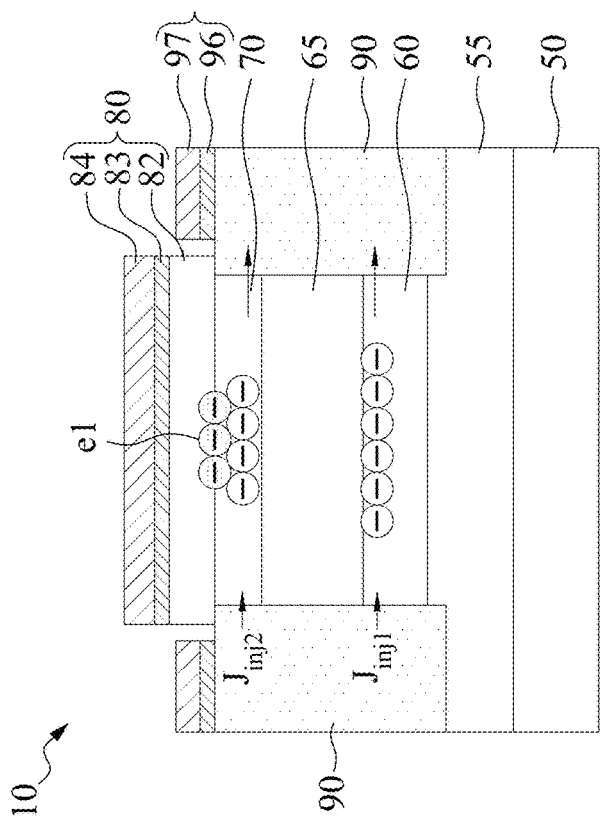

Reference is made to FIGS. 2 and 3D. When the gate voltage is increased from V4 to V5, the system is gradually driven back to equilibrium, as shown in stage V of FIG. 2. This is because, at this stage, the increase of gate voltage could only modulate the carrier density of the semiconductor layer 70. Consequently, the carrier density and the carrier mobility in the semiconductor layer 60 are pinched, resulting in a constant contribution to the total current. Meanwhile, the injected electrons from the source by gating will increase the conductivity of the semiconductor layer 70. However, due to the proximity of the oxide interface, the strong interface roughness scattering would limit the carrier mobility and conductivity in the semiconductor layer 70. Thus, the contribution from the semiconductor layer 70 is relatively small and the drain current does not significantly change with the gate voltage.

As shown in FIG. 2, once the gate voltage is swept back from V5, the current starts to decrease at V6. Since the effective conductance of the semiconductor layer 70 is much smaller than that of the semiconductor layer 60, the slope of I-V curve of backward sweep is smaller than that of forward sweep in stage II. As the gate voltage is further decreased, the carriers in the surface channel (semiconductor layer 70) are drained out first followed by the depletion of the semiconductor layer 70. Once both channels are fully depleted, there will be no available conduction paths between the source and drain regions and the device will be shut off at voltage V7.

Note that the threshold voltage for the device turn-off (e.g., V7) is higher than the threshold voltage for the device turn-on (e.g., V1), which can be attributed to the presence of the semiconductor layer 70 for the backward sweep. For the forward sweep, due to the poor quality of the oxide interface, there is no surface channel formed at the semiconductor layer 70, and thus the buried channel is formed first at the semiconductor layer 60. Thus, the turn-on threshold voltage can be defined as the gate voltage required for the semiconductor layer 60 to be populated with carriers. For the backward sweep, the device is operated at higher gate voltages and both channels are accumulated with carriers. With a decreasing gate voltage, the surface channel (semiconductor layer 70) is depleted first followed by the depletion of the buried channel (semiconductor layer 60). For the surface channel (semiconductor layer 70), the effective capacitance is larger than that for the buried channel (semiconductor layer 60). Furthermore, at high gate voltages, the device has a smaller carrier density than the saturation density in the buried channel (stage III). Thus, a smaller voltage drop is required to deplete the carriers in both channels for the device turn-off. As a result, the device of FIG. 1 can be turn on at a lower voltage (e.g., V1 of FIG. 2), and can be turn off at a higher voltage (e.g., V8 of FIG. 2). Therefore, a hysteresis is present between the forward sweep and the backward sweep.

Figure 4A:
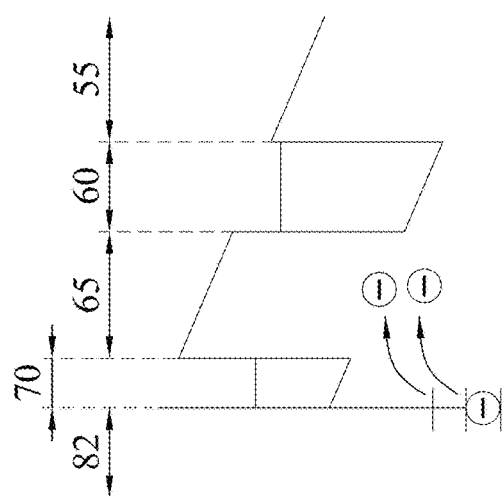
FIG. 4A is a band structure of the memory device in accordance with some embodiments of the present disclosure.
Figure 4B:
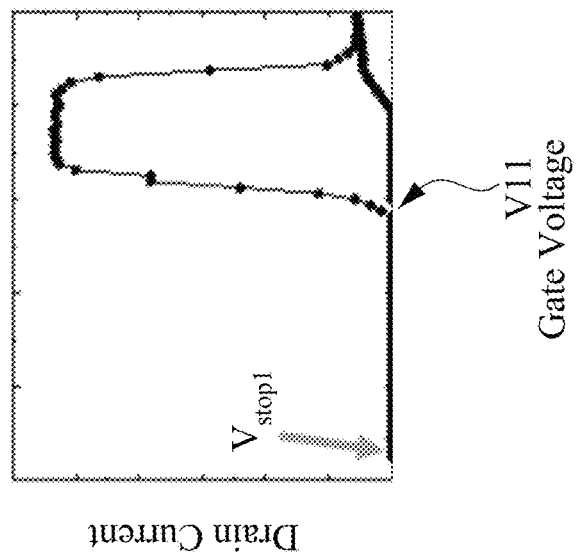
FIG. 4B is a drain current versus gate voltage diagram of a memory device in accordance with some embodiments of the present disclosure.

FIG. 4A is a band structure of the memory device of FIG. 1 in accordance with some embodiments of the present disclosure. FIG. 4B is a drain current versus gate voltage diagram of the memory device of FIG. 1 in accordance with some embodiments of the present disclosure. As mentioned above with respect to FIGS. 1, 2, and 3A-3D, when a forward sweep operation is applied to the device 10 of FIG. 1, the drain current versus gate voltage diagram can be seen at FIG. 2. During the forward sweep operation, electrons may tunnel from the semiconductor layer 60 to the semiconductor layer 70 through the semiconductor spacer 65, and then be trapped at the oxide interface of the gate dielectric 82 (e.g., stage III as discussed in FIG. 2).

Then, a backward sweep operation is applied to the device of FIG. 1 after the forward sweep operation, in which the backward sweep stops at a negative gate voltage $V_{stop1}$ as shown in FIG. 4B. In some embodiments, the gate voltage $V_{stop1}$ is negative enough to "de-trap" the electrons from the oxide interface, which are trapped by the oxide interface during the forward sweep operation. For example, as shown in the band structure of FIG. 4A, the gate voltage $V_{stop1}$ is negative enough to raise the energy level at the oxide interface between the gate dielectric 82 and the semiconductor layer 70, such that the electrons trapped by the oxide interface can "tunnel back" to the semiconductor layer 60, which results in the trapped electrons are de-trapped from the oxide interface.

Because almost all electrons trapped by the oxide interface are released, when a forward sweep operation is again applied to the device of FIG. 1, the I-V characteristic is shown in FIG. 4B, which is similar to the drain current versus gate voltage diagram as discussed in FIG. 2. In FIG. 4B, the threshold voltage of the device may be V11, in which the threshold voltage V11 may be similar to the threshold voltage V1 as discussed in FIG. 2.

Figure 5A:
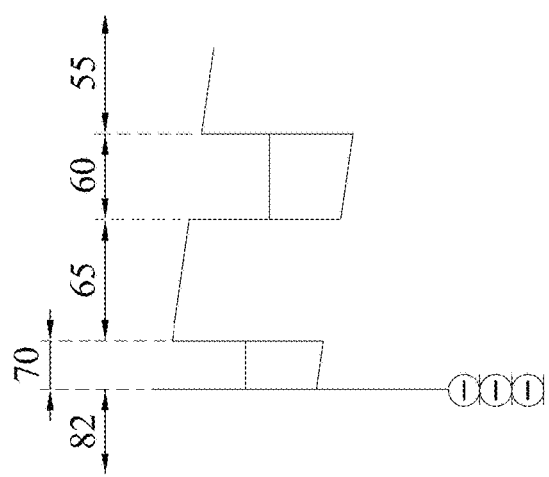
FIG. 5A is a band structure of the memory device in accordance with some embodiments of the present disclosure.
Figure 5B:
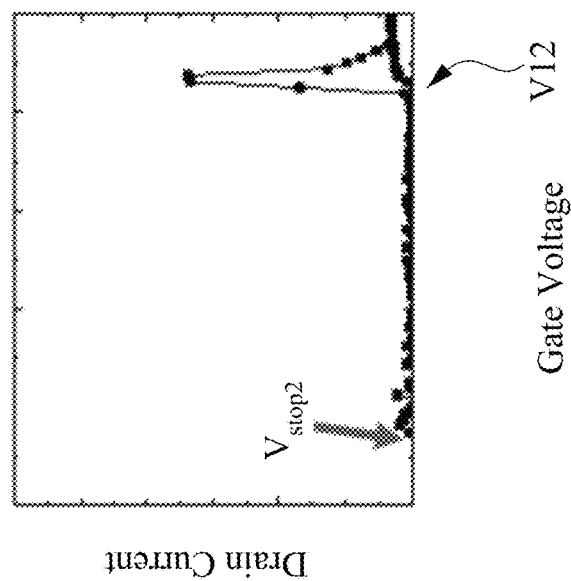
FIG. 5B is a drain current versus gate voltage diagram of a memory device in accordance with some embodiments of the present disclosure.

FIG. 5A is a band structure of the memory device of FIG. 1 in accordance with some embodiments of the present disclosure. FIG. 5B is a drain current versus gate voltage diagram of the memory device of FIG. 1 in accordance with some embodiments of the present disclosure.

FIG. 5A shows another example of the backward sweep operation where the backward sweep stops at a negative gate voltage $V_{stop2}$. The gate voltage $V_{stop2}$ is larger than the gate voltage $V_{stop1}$ of FIG. 4A. However, as shown in FIG. 5A, the gate voltage $V_{stop2}$ is not negative enough to de-trap the electrons at the oxide interface. That is, the electric field caused by the gate voltage $V_{stop2}$ may not be strong enough to release the electrons trapped by the oxide interface defects. As a result, when a forward sweep operation is again applied to the device of FIG. 1, the threshold voltage of the device may be V12, which is higher than the threshold voltage V11 as shown in FIG. 4B. The device is not turned at the gate voltages from −4 V to 4 V since the gate bias is below the threshold voltage. In some embodiments, the absolute value of negative gate voltage $V_{stop1}$ of FIG. 4B is greater than the absolute value of the threshold voltage V11 of FIG. 4B, and is greater than the absolute value of the threshold voltage V12 of FIG. 5B.

As a result, once a forward sweep operation is applied to the device 10 of FIG. 1, the threshold voltage of the device may be increased from V11 to V12. Furthermore, during the backward sweep operation, if the negative gate voltage is negative enough (such as $V_{stop1}$ of FIG. 4A) to de-trap the trapped electrons from oxide interface, the threshold voltage of the device 10 can be changed back to V11. Otherwise, the threshold voltage of the device 10 is kept at a higher level (e.g., V12). Stated another way, it can be seen that under different operations, the device 10 of FIG. 1 may include different threshold voltages, and this makes the device 10 possible to serve as a memory device.

Figure 6B:
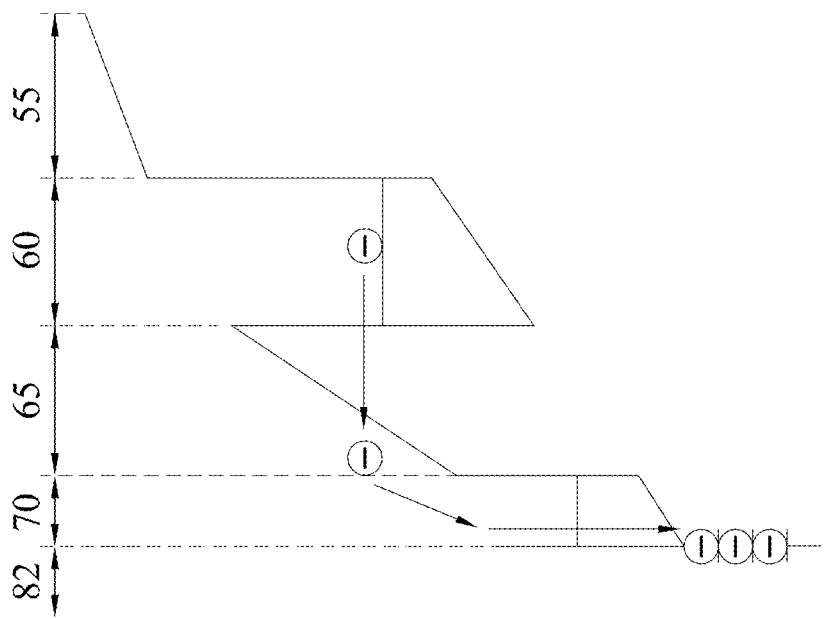
FIG. 6B is a band structure of a memory device under a program operation in accordance with some embodiments of the present disclosure.
Figure 6A:
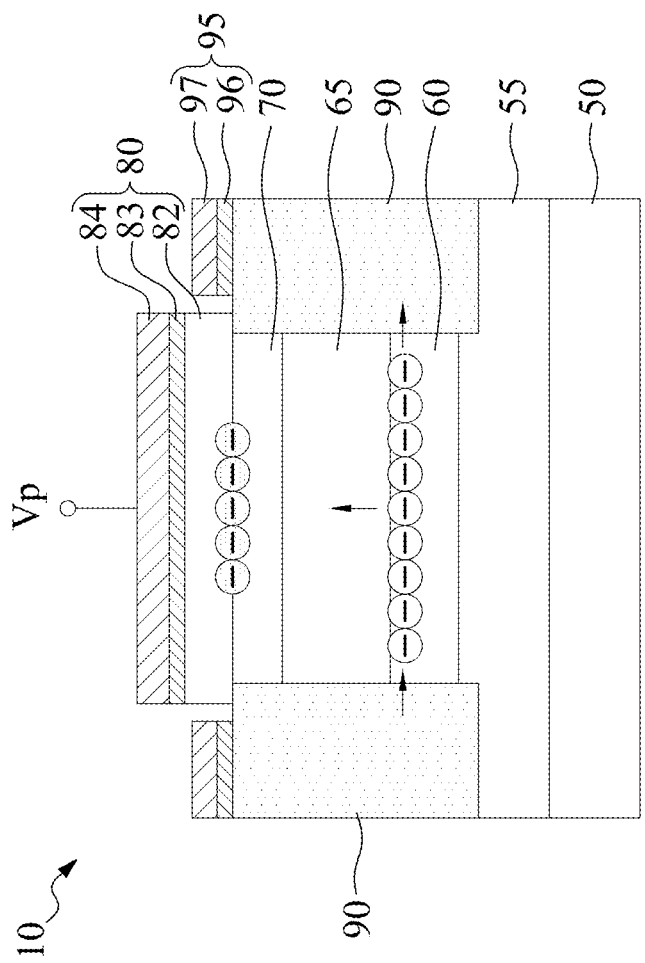
FIG. 6A is a schematic view of a program operation of a memory device in accordance with some embodiments of the present disclosure.

FIG. 6A is a schematic view of a program operation of the memory device 10 in accordance with some embodiments of the present disclosure. FIG. 6B is a band structure of the memory device 10 of FIG. 6A under the program operation in accordance with some embodiments of the present disclosure.

In a program operation, a program voltage $V_P$ is applied to the gate structure 80 of the memory device 10. In some embodiments, the program voltage $V_P$ is a positive voltage. The positive voltage for the program operation is high enough to trigger the electrons tunnel from the semiconductor layer 60 to the semiconductor layer 70, and then be trapped by the oxide interface of the gate dielectric 82. For example, as discussed in FIGS. 2 and 3A to 3C, the voltage for the program operation is high enough to move I-V curve of the device 10 from stage I to stage V, such that the tunneled electrons are trapped by oxide interface of the gate dielectric 82, which will lead the threshold voltage of the device 10 increasing from a lower level (e.g., V11 of FIG. 4B) to a higher level (e.g., V12 of FIG. 5B). Accordingly, after the program operation, the device 10 can be regarded as "programmed", and the I-V curve of the programmed device 10 is similar to the I-V curve of FIG. 513.

Figure 7B:
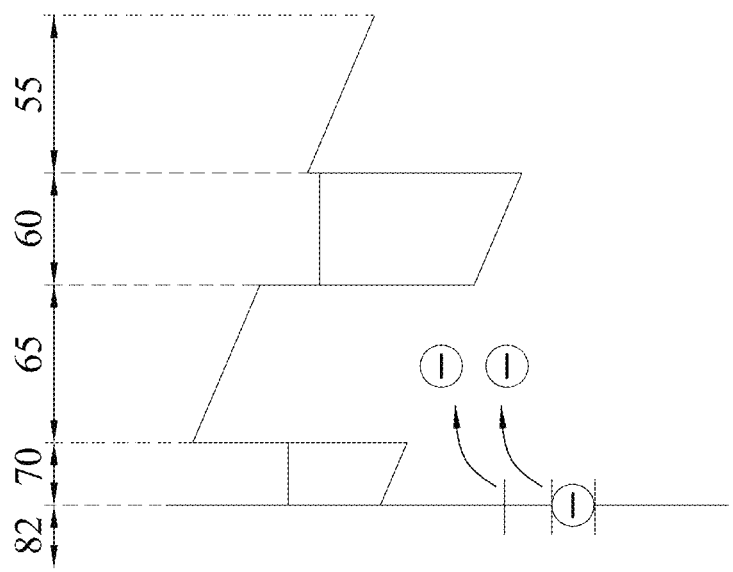
FIG. 7B is a band structure of a memory device under an erase operation in accordance with some embodiments of the present disclosure.
Figure 7A:
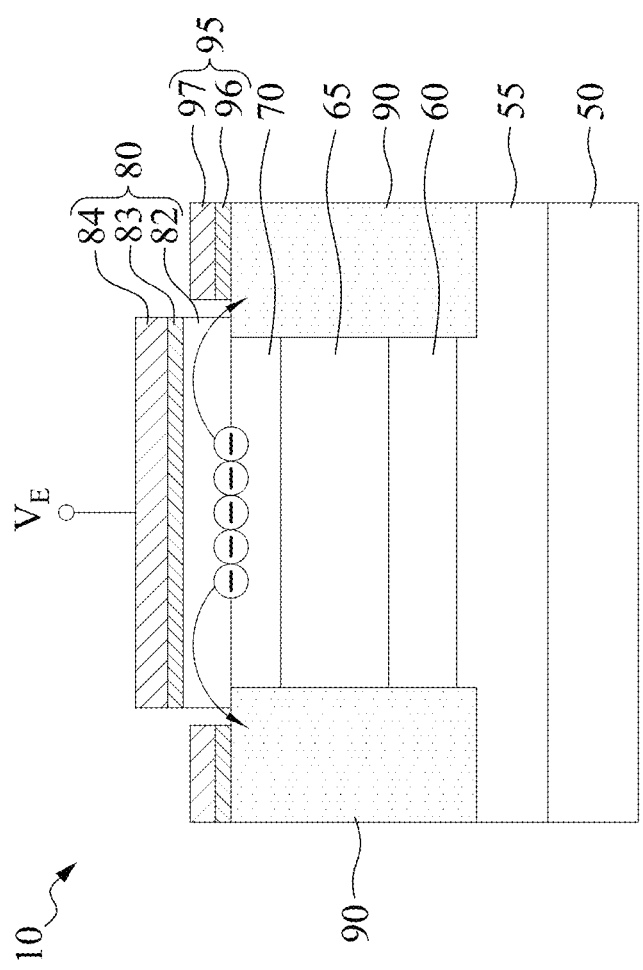
FIG. 7A is a schematic view of an erase operation of a memory device in accordance with some embodiments of the present disclosure.

FIG. 7A is a schematic view of an erase operation of the memory device 10 in accordance with some embodiments of the present disclosure. FIG. 7B is a band structure of the memory device 10 of FIG. 7A under the erase operation in accordance with some embodiments of the present disclosure.

In an erase operation, an erase voltage VE is applied to the gate structure 80 of the memory device 10. In some embodiments, the program voltage $V_P$ is a negative voltage. The voltage for the erase operation is negative enough to de-trap the electrons trapped at the oxide interface of the gate dielectric 82. As discussed in FIGS. 4A and 4B, once the electrons are de-trapped from the oxide interface of the gate dielectric 82, the threshold voltage of the device 10 will decrease from a higher level (e.g., V12 of FIG. 5B) to a lower level (e.g., V11 of FIG. 4B). Accordingly, after the erase operation, the I-V curve of the erased device 10 is similar to the I-V curve of FIG. 2.

In some embodiments, the absolute value of the minimum program voltage $V_P$ for programming the memory device is lower than the absolute value of the maximum erase voltage Vu for erasing the memory device 10. This is because, as mentioned above, a great value of negative voltage is needed to de-trap the electrons from the oxide interface.

Figure 8:
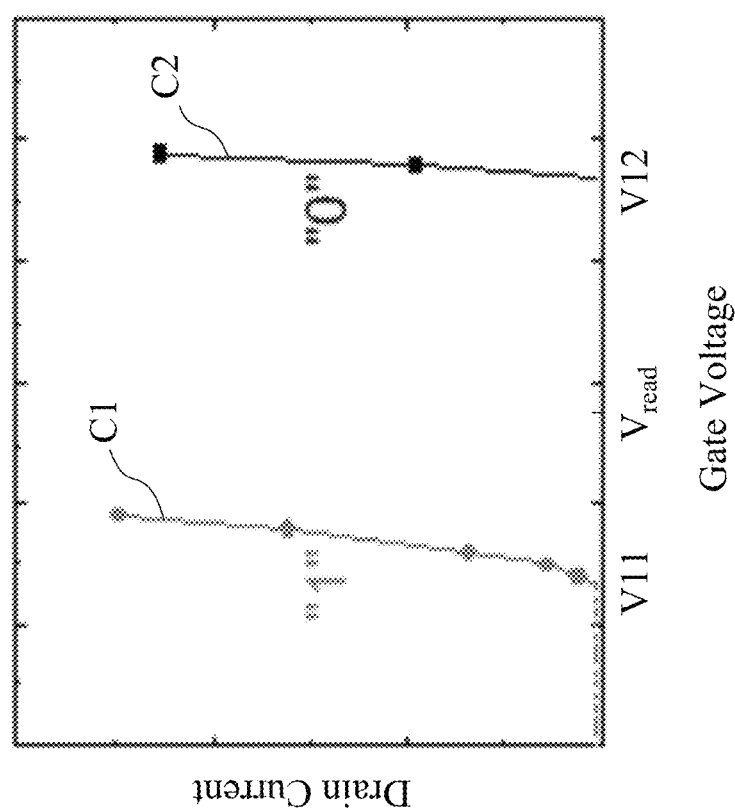
FIG. 8 is a drain current versus gate voltage diagram of a memory device in accordance with some embodiments of the present disclosure.

FIG. 8 is a drain current versus gate voltage diagram of the memory device 10 of FIG. 1 in accordance with some embodiments of the present disclosure. In FIG. 8, two I-V curves C1 and C2 are illustrated, in which the curve C1 denotes the I-V curve of an un-programed device, and the curve C2 denotes the I-V curve of a programed device. Here, the "un-programed" device may indicate a device that has undergone an erase operation, or an original device that does not undergo any program operation.

As shown in FIG. 8, the threshold voltage of the un-programed device 10 is V11, and the threshold voltage of the programed device 10 is V12, in which V12 is higher than V11. Accordingly, during a read operation, a voltage $V_{read}$ is applied to the gate structure 80 of the memory device 10, and data can be read depending on whether the drain current is greater than a predetermined threshold (e.g., greater than 0 µA). It is noted that the read voltage $V_{read}$ is greater than the threshold voltage V11 of the un-programed device 10 and is lower than the threshold voltage V12 of the programed device 10.

For instance, during a read operation of an un-programed device 10, because the read voltage $V_{read}$ is greater than the threshold voltage V11 of the un-programed device 10, the un-programed device 10 will be turn on, thereby increasing the drain current of the un-programed device 10. Accordingly, data '1' can be read out from the un-programed device 10. However, during a read operation of a programed device 10, because the read voltage $V_{read}$ is lower than the threshold voltage V12 of the programed device 10, and is unable to turn on the programed device 10. Accordingly, drain current of the programed device 10 will not increase, and data '0' can be read out from the programed device 10. That is, if a memory device 10 is un-programed, the drain current may have a logic level of '1'; if a memory device 10 is pro-gramed, the drain current may have a logic level of '0'. It is noted that, as the memory device 10 can be electrically erased and reprogrammed, the memory device 10 can also be referred to as a flash memory device.

FIGS. 9 to 15 illustrate a method in various stages of fabricating the memory device in accordance with some embodiments of the present disclosure. It is noted that some elements of FIGS. 9 to 15 are similar to those described in FIG. 1, and thus such elements are labeled the same, and relevant details may not be repeated for simplicity.

Figure 9:
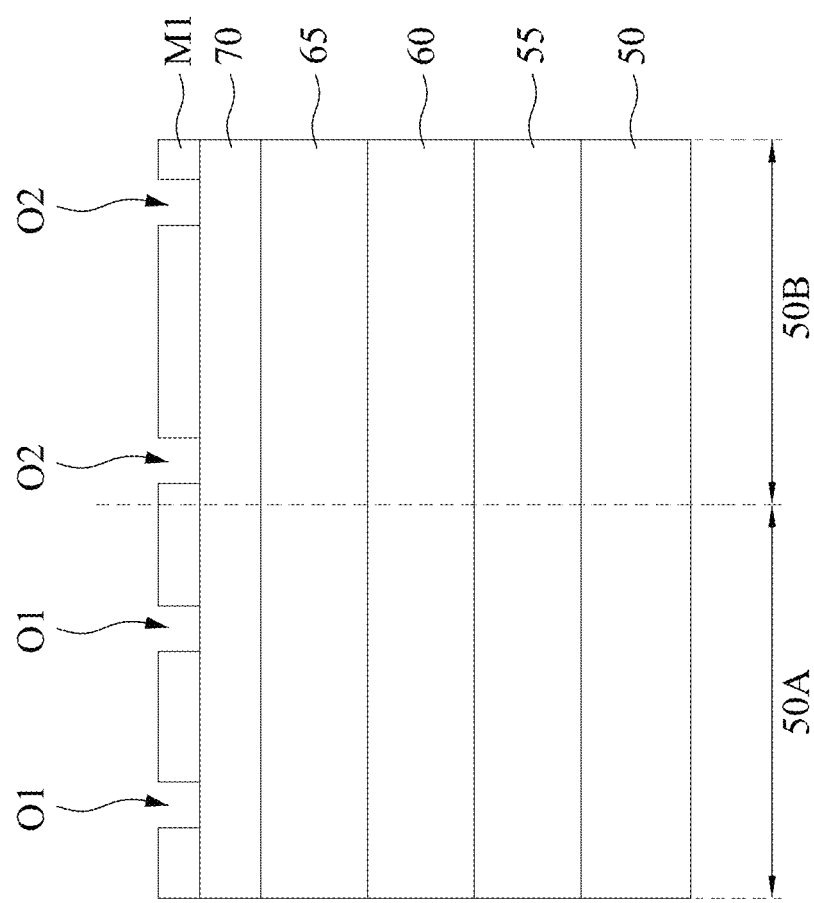
FIGS. 9 to 15 illustrate a method in various stages of fabricating the memory device in accordance with some embodiments of the present disclosure.

Reference is made to FIG. 9. A semiconductor substrate 50 is provided. The semiconductor substrate 50 may include a first device region 50A and a second device region SOB. In some embodiments, a first device (e.g., the memory device 10 of FIG. 15) may be formed over the first device region 50A of the semiconductor substrate 50, and a second device (e.g., the device 20 of FIG. 15) may be formed over the second device region SOB of the semiconductor substrate 50. In some embodiments, an implantation process may be performed to the semiconductor substrate 50 to form a doped semiconductor substrate 50. For example, the semiconductor substrate 50 may be a silicon substrate doped with p-type dopants, such as boron (B).

A strain relaxed buffer layer 55, a semiconductor layer 60, a semiconductor spacer 65, and a semiconductor layer 70 are sequentially deposited over the semiconductor substrate 50. In some embodiments, the strain relaxed buffer layer 55, the semiconductor layer 60, the semiconductor spacer 65, and the semiconductor layer 70 may be deposited by suitable process, such as a chemical vapor deposition (CVD) pro-cess, a physical vapor deposition (PVD) process, an atomic layer deposition (ALD) process, or other suitable deposition process. In an example where the strain relaxed buffer layer 55 is made of SiGe, an ultrahigh vacuum chemical vapor deposition (UHVCVD) may be performed with $SiH_4$ and $GeH_4$ as the precursors. A patterned mask M1 is formed over the semiconductor layer 70. In some embodiments, the patterned mask M1 may include openings O1 exposing portions of the semiconductor layer 70 within the first device region 50A of the semiconductor substrate 50, and may include openings O2 exposing other portions of the semi-conductor layer 70 within the second device region 50B of the semiconductor substrate 50. In some embodiments, the patterned mask M1 may be formed by photolithography process. The patterned mask M1 may be a photoresist, or may be a hard mask.

Figure 10:
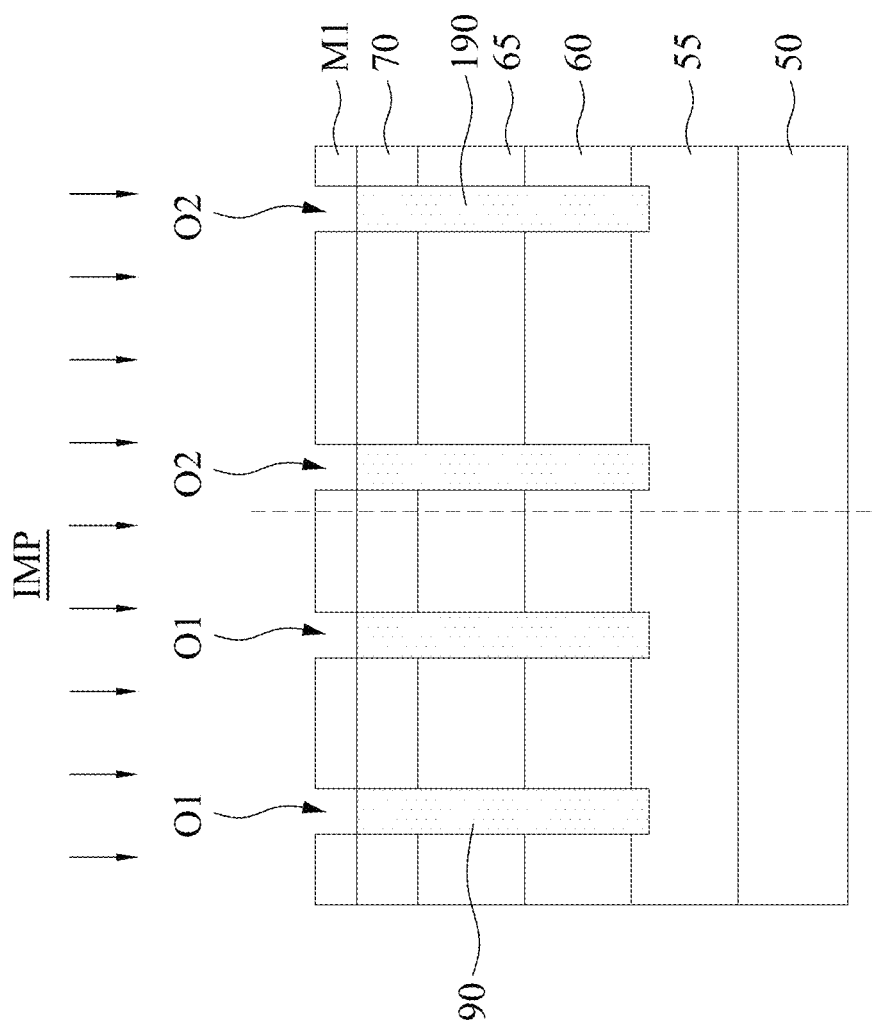

Reference is made to FIG. 10. An implantation process IMP is performed, through the openings O1 and O2 of the patterned mask M1, to form source/drain regions 90 in the strain relaxed buffer layer 55, the semiconductor layer 60, the semiconductor spacer 65, and the semiconductor layer 70 within the first device region 50A of the semiconductor substrate 50, and to form source/drain regions 190 in the strain relaxed buffer layer 55, the semiconductor layer 60, the semiconductor spacer 65, and the semiconductor layer 70 within the second device region 50B of the semiconduc-tor substrate 50. For example, n-type dopants such as phosphorus is implanted into the areas exposed by the openings O1 and O2 of the patterned mask M1. In some embodiments, the implantation process IMP may be per-formed such that the bottommost ends of the source/drain regions 90 and 190 are lower than the top surface of the strain relaxed buffer layer 55, and are higher than the bottom surface of the strain relaxed buffer layer 55.

Figure 11:
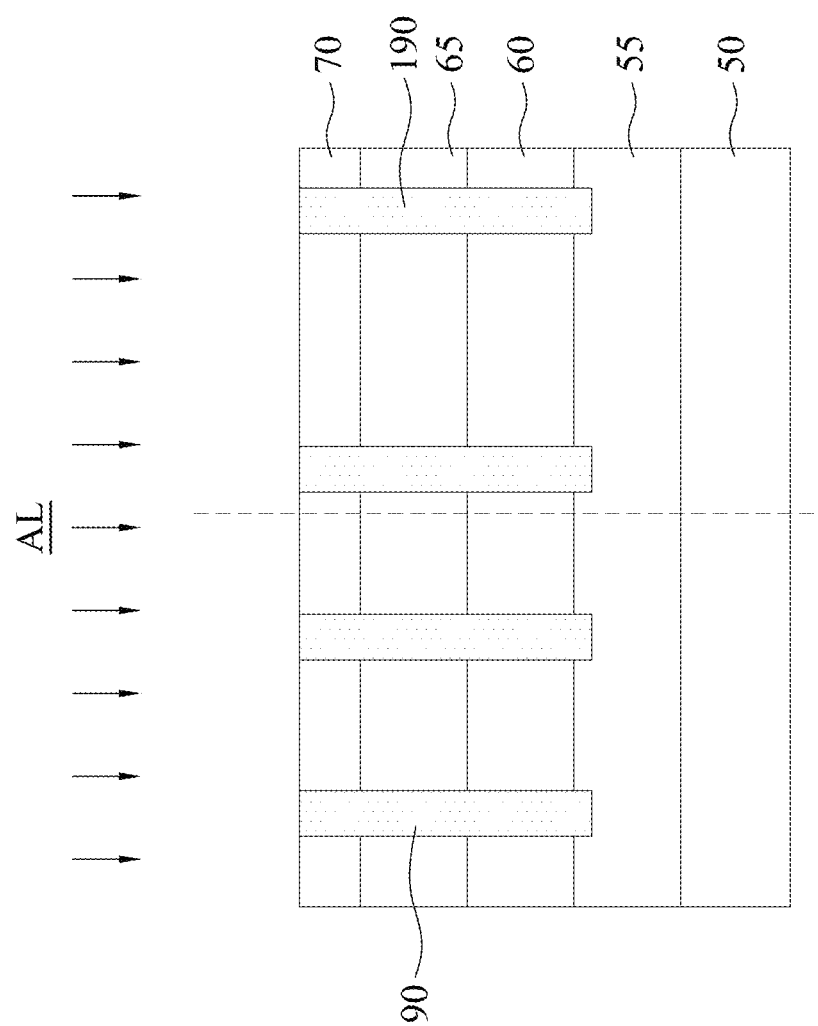

Reference is made to FIG. 11. After the implantation process IMP is complete, the patterned mask M1 is removed. Afterward, an annealing process AL is performed to activate the carriers in the source/drain regions 90 and 190. In some embodiments, the annealing process AL may be performed at a temperature in a range from about 550° C. to about 650° C., such as 500° C., and may be performed for 1 about hour to about 1.5 hour.

Figure 12:
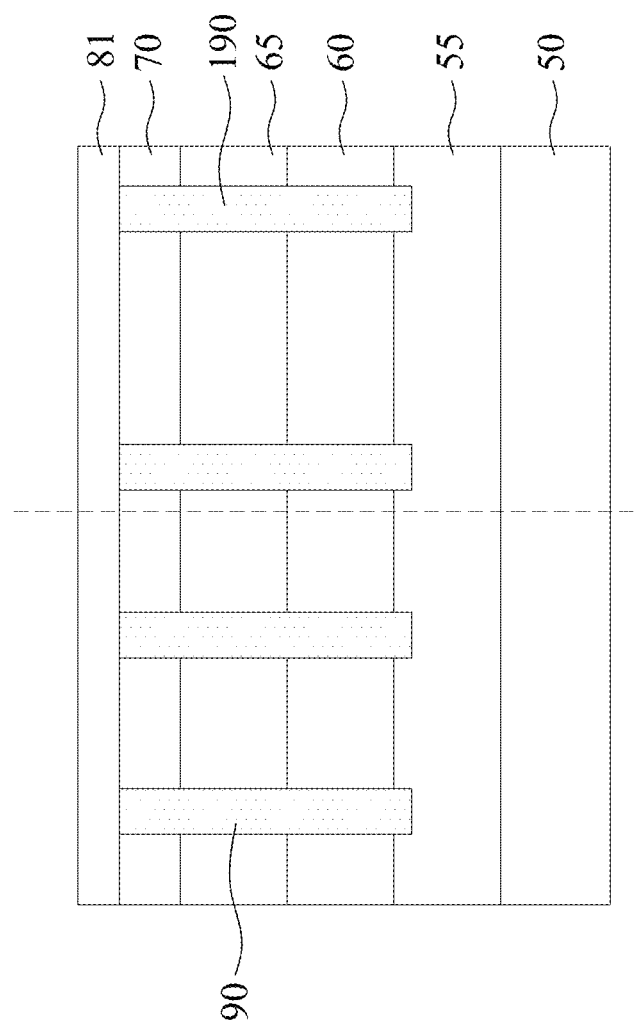

Reference is made to FIG. 12. A gate dielectric layer 81 is deposited blanket over the semiconductor layer 70. In some embodiments, the gate dielectric layer 81 may be deposited by suitable process, such as a chemical vapor deposition (CVD) process, a physical vapor deposition (PVD) process, an atomic layer deposition (ALD) process, or other suitable deposition process. In some embodiments where the gate dielectric layer 81 is made of $Al_2O_3$, the gate dielectric layer 81 may be formed using ALD at a tempera-ture in a range from about 200° C. to about 300° C., such as 250° C.

Figure 13:
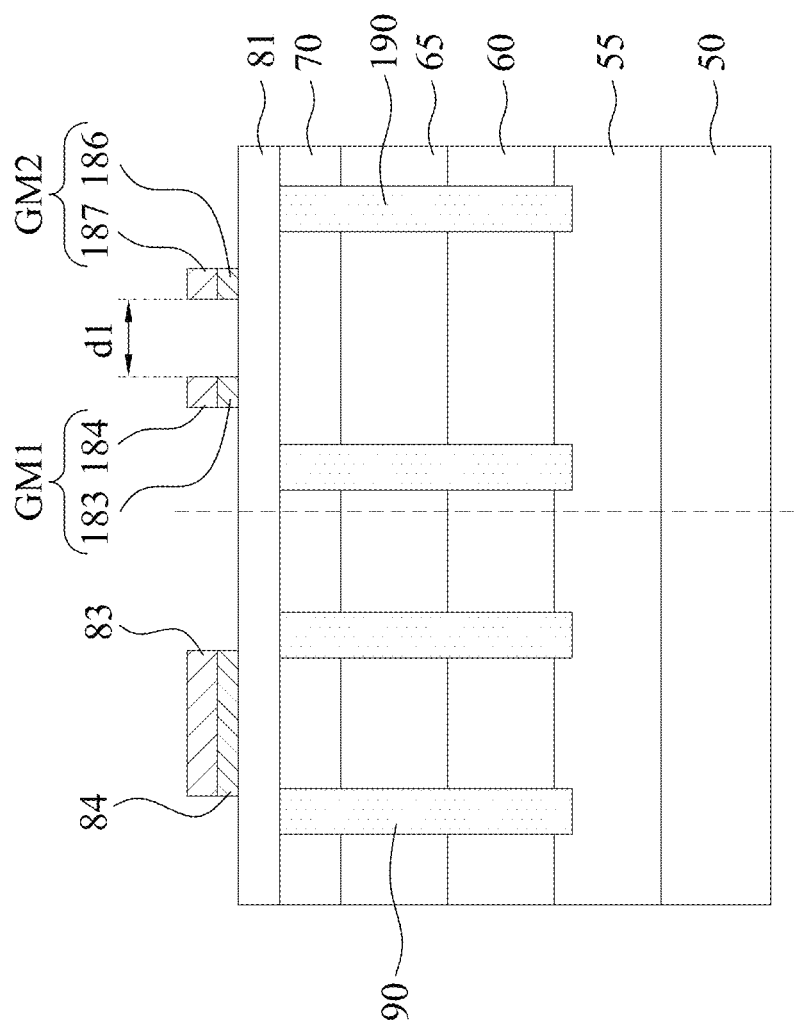

Reference is made to FIG. 13. Adhesion metals 83, 183, and 186 are formed over the gate dielectric layer 81, and gate electrodes 84, 184, and 187 are formed over the adhesion metals 83, 183, and 186, respectively. In greater details, the adhesion metal 83 and the gate electrode 84 are formed within the first device region 50A of the semiconductor substrate 50, and the adhesion metal 183, 186, and the gate electrodes 184, 184 are formed within the second device region 50B of the semiconductor substrate 50. In some embodiments, the adhesion metal 83 is wider than each of the adhesion metals 183 and 186, and the gate electrode 84 is wider than each of the gate electrodes 184 and 187. In some embodiments, the adhesion metal 183 and the over-lying gate electrodes 184 may collectively form a first gate metal GM1, and the adhesion metal 186 and the overlying gate electrodes 187 may collectively form a second gate metal GM2. In some embodiments, a distance dl between the first gate metal GM1 and the second gate metal GM2 may be in a range from about 10 nm to about 50 nm. In some embodiments, an adhesion metal layer is deposited blanket over the semiconductor substrate 50, and a gate electrode layer is deposited blanket over the adhesion metal layer. A patterning process is performed to adhesion metal layer and the gate electrode layer to form the adhesion metals 83, 183, 186, and the gate electrodes 84, 184, 187. In some embodiments, the adhesion metals 83, 183, 186 and the gate electrodes 84, 184, 187 may be deposited by suitable deposition process, such as thermal evaporation, a chemical vapor deposition (CVD) process, a physical vapor deposition (PVD) process, an atomic layer deposition (ALD) process, or other suitable deposition process.

Figure 14:
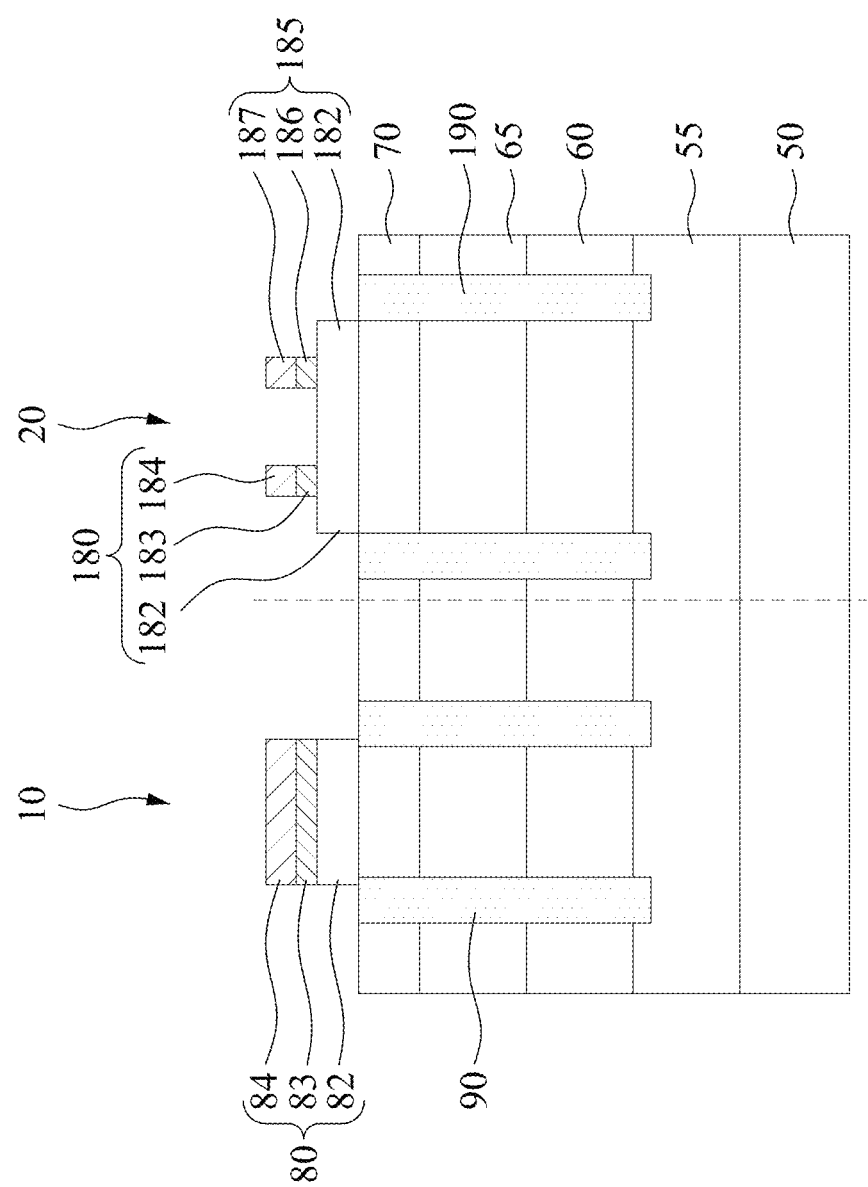

Reference is made to FIG. 14. The gate dielectric layer 81 is patterned to expose the source/drain regions 90 and 190. The gate dielectric layer 81 may be patterned by, for example, forming a patterned mask over the semiconductor substrate 50 that exposed the unwanted portions of the gate dielectric layer 81, performing an etching process to remove the unwanted portions of the gate dielectric layer 81 to expose the source/drain regions 90 and 190. In some embodiments, the remaining portion of the gate dielectric layer 81 under the adhesion metal 83 and the gate electrode 84 can be referred to as gate dielectric 82. The remaining portion of the gate dielectric layer 81 under the adhesion metals 183, 186 and the gate electrodes 184, 187 can be referred to as gate dielectric 182. The gate dielectric 82, the adhesion metal 83, and the gate electrode 84 can be collectively referred to as a gate structure 80. The gate dielectric 182, the adhesion metal 183, and the gate electrode 184 can be collectively referred to as a gate structure 180. The gate dielectric 182, the adhesion metal 186, and the gate electrode 187 can be collectively referred to as a gate structure 185.

The gate structure 80, the source/drain regions 90, and the underlying semiconductor layers 60 and 70 (channel regions) collectively form a first device 10 within the first device region 50A of the substrate 50. In some embodiments, the first device 10 may be a flash memory device as discussed above with respect to FIGS. 1 to 8. In some other embodiments, the first device 10 may be a logic device.

On the other hand, the gate structures 180, 185, the source/drain regions 190, and the underlying semiconductor layers 60 and 70 (channel regions) collectively form a second device 20 within the second device region 50B of the substrate 50. In some embodiments, the second device region SOB can be referred to as a quantum dot device. This is because, when the gate structures 180 and 185 are applied with certain biases, carriers may be confined within the channel regions (e.g., semiconductor layers 60 and 70) between the gate structures 180 and 185, resulting in a quantum confinement in one-dimension. A gate-defined quantum dot device is then formed.

Figure 15:
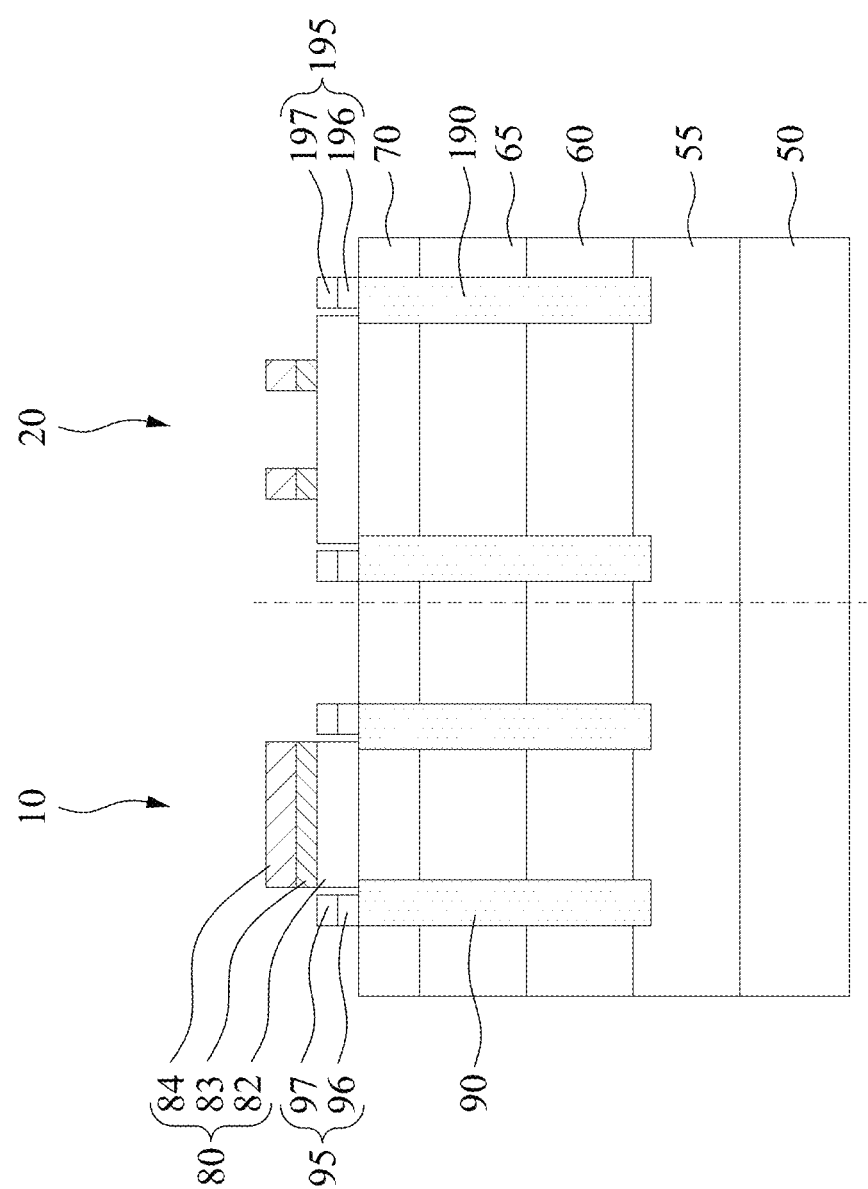

Reference is made to FIG. 15. Source/drain contacts 95 are formed over the source/drain regions 90, respectively, and source/drain contacts 195 are formed over the source/drain regions 190, respectively. In some embodiments, each of the source/drain contacts 95 includes an adhesion metal 96 and a contact electrode 97 over the adhesion metal 96, and each of the source/drain contacts 195 includes an adhesion metal 196 and a contact electrode 197 over the adhesion metal 196. In some embodiments, the source/drain contacts 95 and 195 may be formed by, for example, forming a patterned mask over the semiconductor substrate 50 having openings that define the positions of the source/drain contacts 95 and 195, depositing a adhesion metal layer in the openings, depositing an contact electrode layer over the adhesion metal layer, and lifting off the patterned mask. In some embodiments, the adhesion metals 96, 192 and the contact electrodes 97, 197 may be deposited by suitable deposition process, such as thermal evaporation, a chemical vapor deposition (CVD) process, a physical vapor deposition (PVD) process, an atomic layer deposition (ALD) process, or other suitable deposition process.

Figure 16:
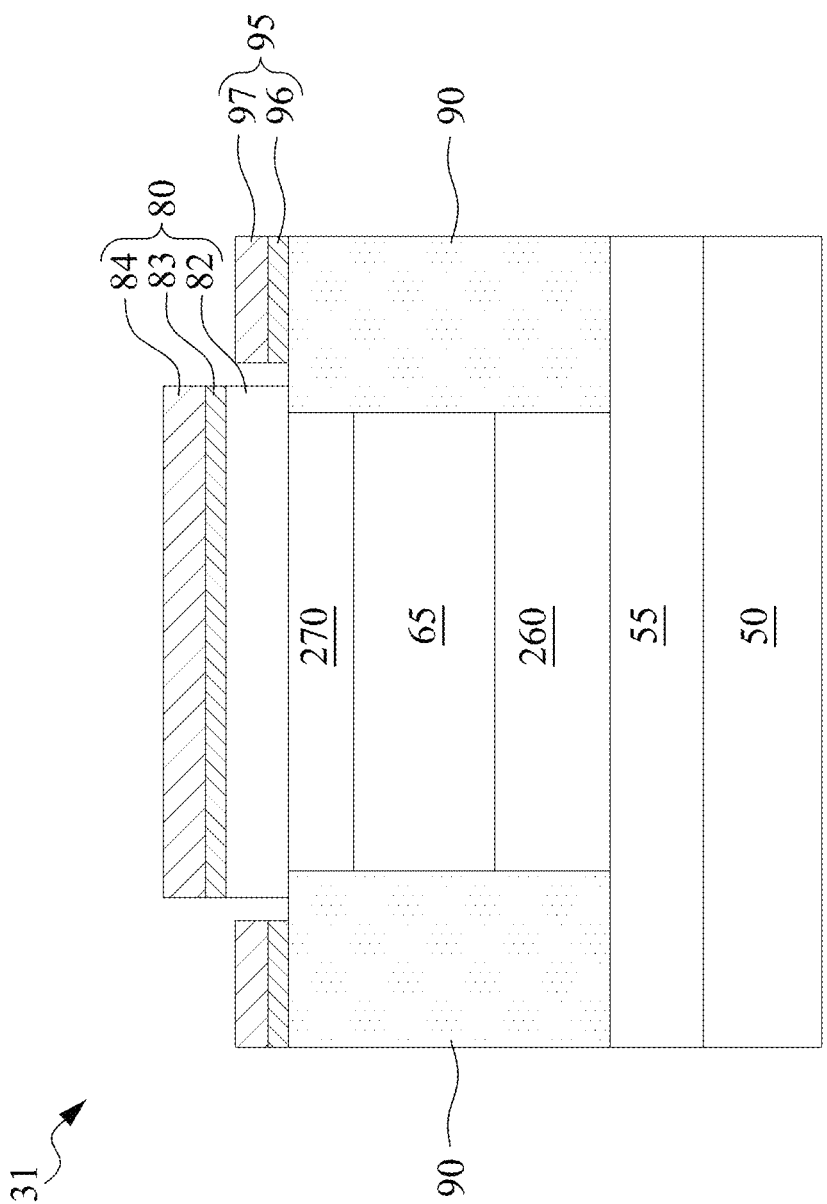
FIG. 16 is a cross-sectional view of a memory device in accordance with some embodiments.

FIG. 16 is a cross-sectional view of a memory device in accordance with some embodiments. It is noted that some elements of FIG. 16 are similar to the elements described in FIG. 1, such elements are labeled the same, and relevant details will not be repeated for simplicity.

FIG. 16 is different from FIG. 1, in that the memory device 31 of FIG. 16 includes a semiconductor layer 260 disposed over the strain relaxed buffer layer 55. The semiconductor spacer 65 is disposed over the semiconductor layer 260. A semiconductor layer 270 is disposed over the semiconductor spacer 65. In some embodiments, the semiconductor layer 260, the semiconductor spacer 65, and the semiconductor layer 270 are made of silicon germanium (SiGe). In some embodiments, the semiconductor spacer 65 may include composition $Si_{(1-y)}Ge_y$ where y is a number ranging from 0 to 1, indicating the atomic percentage of germanium in the semiconductor spacer 65. On the other hand, the semiconductor layers 260 and 270 may include composition $Si_{(1-x)}Ge_x$ where x is a number ranging from 0 to 1, indicating the atomic percentage of germanium in the semiconductor layers 260 and 270. In some embodiments, y is greater than x. Stated another way, the atomic percentage of germanium in the semiconductor spacer 65 is higher than the atomic percentages of germanium in the semiconductor layers 260 and 270. In some embodiments, the atomic percentages of germanium in the semiconductor layers 260 and 270 are substantially the same. In some embodiments, the difference between the atomic percentage of germanium in the semiconductor layer 260 and the atomic percentage of germanium in the semiconductor layer 270 is less than 2%. The semiconductor layers 260 and 270 may be formed by suitable deposition process as the semiconductor layers 60 and 70 of FIG. 1, such as a chemical vapor deposition (CVD) process, a physical vapor deposition (PVD) process, an atomic layer deposition (ALD) process, or other suitable deposition process. In some embodiments, the semiconductor layers 260 and 270 may function as channel layers as the semiconductor layers 60 and 70 discussed FIGS. 1 to 8.

Figure 17:
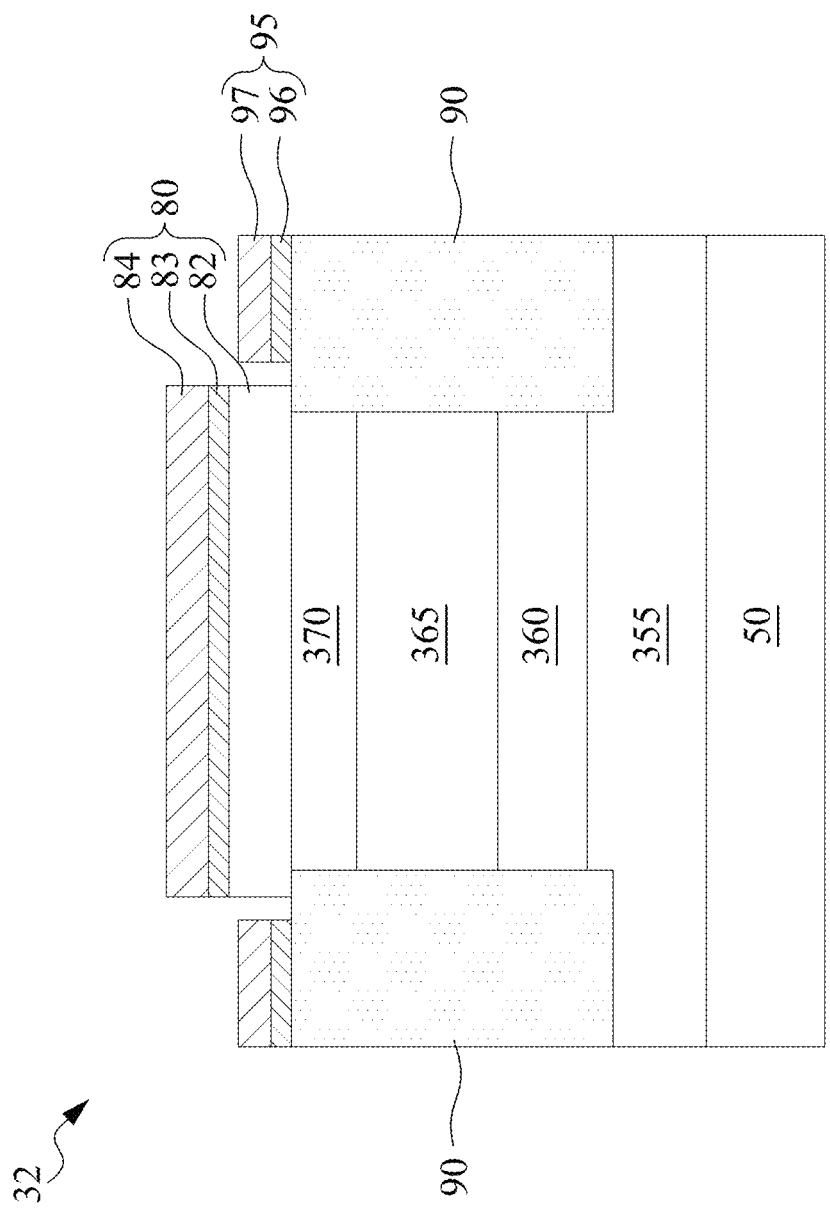
FIG. 17 is a cross-sectional view of a memory device in accordance with some embodiments.

FIG. 17 is a cross-sectional view of a memory device in accordance with some embodiments. It is noted that some elements of FIG. 17 are similar to the elements described in FIG. 1, such elements are labeled the same, and relevant details will not be repeated for simplicity.

FIG. 17 is different from FIG. 1, in that the memory device 32 of FIG. 17 includes a strain relaxed buffer layer 355 over the semiconductor substrate 50, a semiconductor layer 360 over the strain relaxed buffer layer 355, a semiconductor spacer 365 over the semiconductor layer 360, and a semiconductor layer 370 over the semiconductor spacer 365. The semiconductor layers 360 and 370 will function as channel layers as the semiconductor layers 60 and 70 discussed in FIGS. 1 to 8.

In some embodiments, the strain relaxed buffer layer 355 is made of GeSi, the semiconductor layer 360 is made of Ge, the semiconductor spacer 365 is made of GeSi, and the semiconductor layer 370 is made of Ge.

In some other embodiments, the strain relaxed buffer layer 355, the semiconductor layer 360, the semiconductor spacer 365, and the semiconductor layer 370 are made of GeSi. In some embodiments, the semiconductor spacer 365 may include composition $Ge_{(1-y)}Si_y$ where y is a number ranging from 0 to 1, indicating the atomic percentage of silicon in the semiconductor spacer 365. On the other hand, the semiconductor layers 360 and 370 may include composition $Ge_{(1-x)}Si_x$ where x is a number ranging from 0 to 1, indicating the atomic percentage of silicon in the semiconductor layers 360 and 370. In some embodiments, y is greater than x. Stated another way, the atomic percentage of silicon in the semiconductor spacer 365 is higher than the atomic percentages of silicon in the semiconductor layers 360 and 370. In some embodiments, the atomic percentages of silicon in the semiconductor layers 360 and 370 are substantially the same. In some embodiments, the difference between the atomic percentage of silicon in the semiconductor layer 460 and the atomic percentage of silicon in the semiconductor layer 470 is less than 2%.

The deposition of the strain relaxed buffer layer 355, the semiconductor layer 360, the semiconductor spacer 365, and the semiconductor layer 370 may be similar to the deposition of strain relaxed buffer layer 55, the semiconductor layer 60, the semiconductor spacer 65, and the semiconductor layer 70 as discussed in FIGS. 9 to 15, such as using a chemical vapor deposition (CVD) process, a physical vapor deposition (PVD) process, an atomic layer deposition (ALD) process, or other suitable deposition process. In some embodiments, during depositing the semiconductor layer 360 over the strain relaxed buffer layer 355, lattice mismatch will create compressive strain to the semiconductor layer 360, and thus the semiconductor layer 360 can also be referred to as a compressive strained semiconductor layer.

Source/drain regions 390 are disposed in the strain relaxed buffer layer 355, the semiconductor layer 360, the semiconductor spacer 365, and the semiconductor layer 370. The source/drain regions 390 may be doped regions, in which the dopants of the source/drain regions 390 may be p-type dopants, such as boron (B). Accordingly, the memory device 32 is a p-type memory device. The formation of the source/drain regions 390 may be similar to the source/drain regions 90, the different is that p-type dopant is used in the implantation process for forming the source/drain regions 390.

Figure 18:
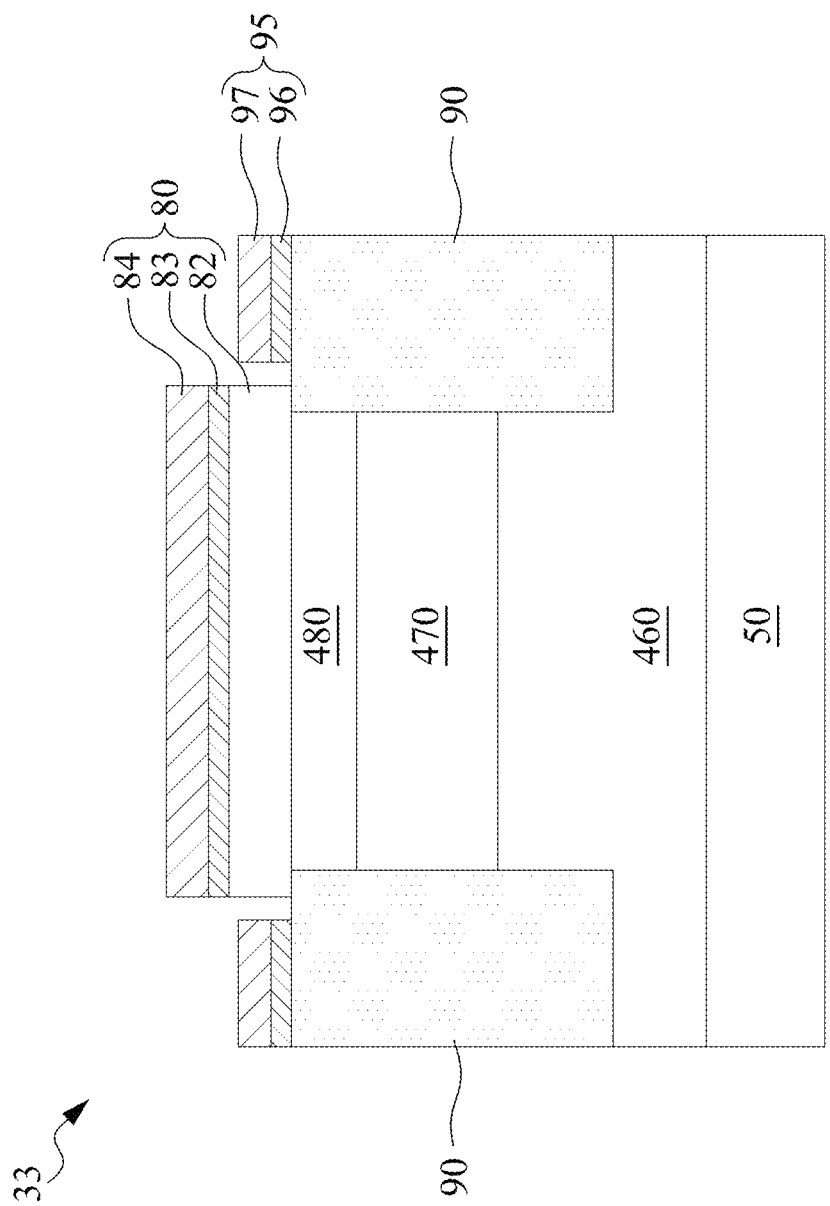
FIG. 18 is a cross-sectional view of a memory device in accordance with some embodiments.

FIG. 18 is a cross-sectional view of a memory device in accordance with some embodiments. It is noted that some elements of FIG. 18 are similar to the elements described in FIG. 1, such elements are labeled the same, and relevant details will not be repeated for simplicity.

FIG. 18 is different from FIG. 1, in that the memory device 33 of FIG. 18 includes a semiconductor layer 460 over the semiconductor substrate 50, a semiconductor spacer 465 over the semiconductor layer 460, and a semiconductor layer 470 over the semiconductor spacer 465. In some embodiments, there is no buffer layer (e.g., the relaxed buffer layer 55 of FIG. 1) between the semiconductor layer 460 and the semiconductor substrate 50. The semiconductor layers 460 and 470 will function as channel layers as the semiconductor layers 60 and 70 discussed in FIGS. 1 to 8.

In some embodiments, the semiconductor layer 460 is made of gallium arsenide (GaAs), the semiconductor spacer 465 is made of aluminum gallium arsenide (AlGaAs), and the semiconductor layer 470 is made of gallium arsenide (GaAs).

In some other embodiments, the semiconductor layer 460 is made of indium gallium arsenide (InGaAs), the semiconductor spacer 465 is made of indium aluminum arsenide (InAlAs), and the semiconductor layer 470 is made of indium gallium arsenide (InGaAs).

In some other embodiments, the semiconductor layer 460 is made of gallium nitride (GaN), the semiconductor spacer 465 is made of aluminum gallium nitride (AlGaN), and the semiconductor layer 470 is made of gallium nitride (GaN).

The deposition of the semiconductor layer 460, the semiconductor spacer 465, and the semiconductor layer 470 may be similar to the deposition of the semiconductor layer 60, the semiconductor spacer 65, and the semiconductor layer 70 as discussed in FIGS. 9 to 15, such as using a chemical vapor deposition (CVD) process, a physical vapor deposition (PVD) process, an atomic layer deposition (ALD) process, or other suitable deposition process.

Source/drain regions 490 are disposed in the semiconductor layer 460, the semiconductor spacer 365, and the semiconductor layer 470. The source/drain regions 490 may be doped regions. In some embodiments, the dopants of the source/drain regions 490 may be p-type dopants, such as boron (B), and the memory device 33 is a p-type memory device. In some other embodiments, the dopants of the source/drain regions 490 may be n-type dopants, such as phosphorus (P), and the memory device 33 is an n-type memory device. The formation of the source/drain regions 490 may be similar to the source/drain regions 90 discussed in FIGS. 9 to 15, while the dopants used in the implantation process can be n-type or p-type.

Figure 19:
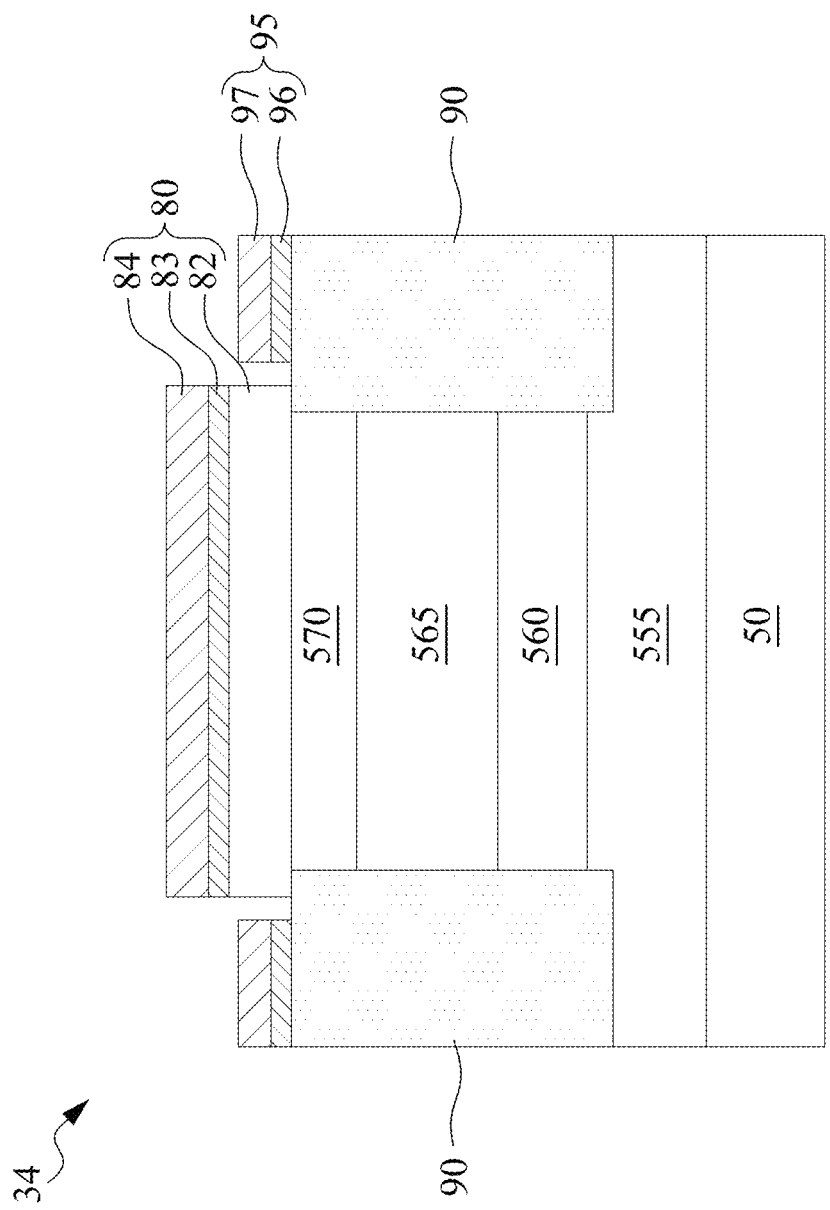
FIG. 19 is a cross-sectional view of a memory device in accordance with some embodiments.

FIG. 19 is a cross-sectional view of a memory device in accordance with some embodiments. It is noted that some elements of FIG. 19 are similar to the elements described in FIG. 1, such elements are labeled the same, and relevant details will not be repeated for simplicity.

FIG. 19 is different from FIG. 1, in that the memory device 34 of FIG. 19 includes a strain relaxed buffer layer 555 over the semiconductor substrate 50, a semiconductor layer 560 over the strain relaxed buffer layer 555, a semiconductor spacer 565 over the semiconductor layer 560, and a semiconductor layer 570 over the semiconductor spacer 565.

In some embodiments, the strain relaxed buffer layer 555 is made of germanium (Ge), the semiconductor layer 560 is made of germanium tin (GeSn), the semiconductor spacer 365 is made of germanium (Ge), and the semiconductor layer 570 is made of germanium tin (GeSn).

The deposition of the strain relaxed buffer layer 555, the semiconductor layer 560, the semiconductor spacer 565, and the semiconductor layer 570 may be similar to the deposition of strain relaxed buffer layer 55, the semiconductor layer 60, the semiconductor spacer 65, and the semiconductor layer 70 as discussed in FIGS. 9 to 15, such as using a chemical vapor deposition (CVD) process, a physical vapor deposition (PVD) process, an atomic layer deposition (ALD) process, or other suitable deposition process.

Source/drain regions 590 are disposed in the strain relaxed buffer layer 555, the semiconductor layer 560, the semiconductor spacer 565, and the semiconductor layer 570. The source/drain regions 590 may be doped regions. In some embodiments, the dopants of the source/drain regions 590 may be p-type dopants, such as boron (B), and the memory device 34 is a p-type memory device. In some other embodiments, the dopants of the source/drain regions 590 may be n-type dopants, such as phosphorus (P), and the memory device 34 is an n-type memory device. The formation of the source/drain regions 590 may be similar to the source/drain regions 90 discussed in FIGS. 9 to 15, while the dopants used in the implantation process can be n-type or p-type.

Figure 20C:
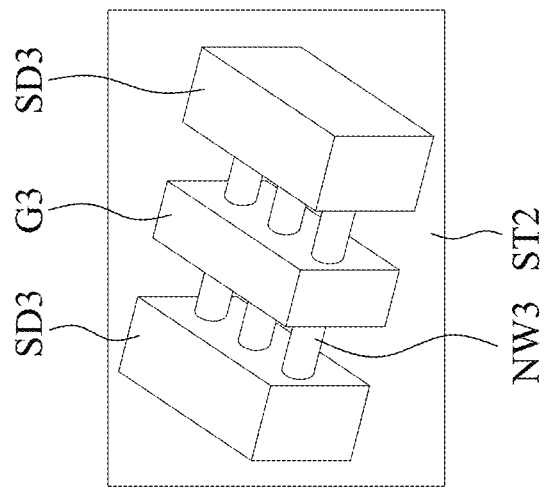
FIGS. 20A to 20E illustrate schematic views of different structures of memory device in accordance with some embodiments.
Figure 20B:
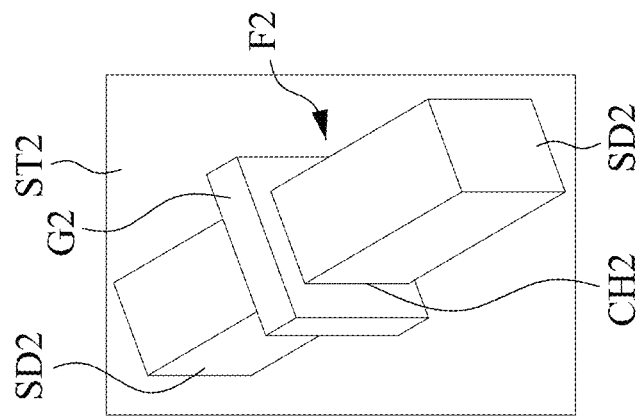
Figure 20A:
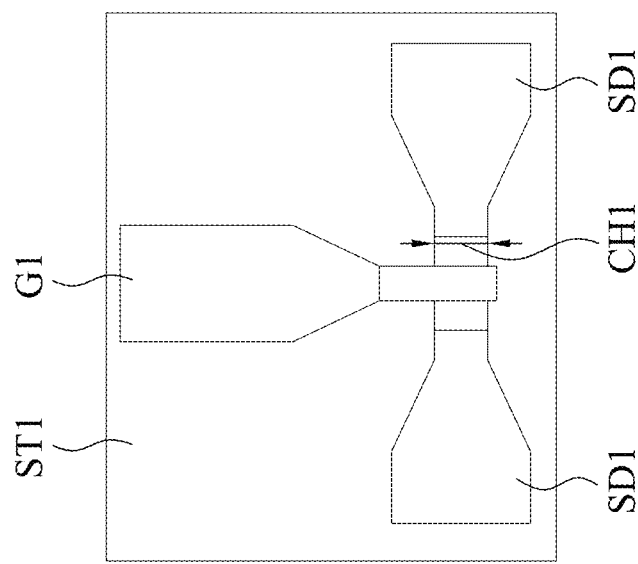

FIGS. 20A to 20E illustrate schematic views of different structures of memory device in accordance with some embodiments. FIG. 20A illustrates a planar memory device. The planar memory device includes a substrate ST1, a channel structure over the substrate ST1, a gate structure G1 over the channel structure CH1, and source/drain contacts SD1 over the channel structure CH1 and on opposite sides of the gate structure G1. In some embodiments, the gate structure G1 may be the gate structure 80 as discussed in FIG. 1. The source/drain contacts SD1 may be the source/drain contacts 95 as discussed in FIG. 1.

In some embodiments, the channel structure CH1 may include the stack of strain relaxed buffer layer 55, the semiconductor layer 60, the semiconductor spacer 65, and the semiconductor layer 70 as discussed in FIG. 1. The channel structure CH1 may also include the stack of strain relaxed buffer layer 55, the semiconductor layer 260, the semiconductor spacer 65, and the semiconductor layer 270 as discussed in FIG. 16. The channel structure CH1 may also include the stack of strain relaxed buffer layer 355, the semiconductor layer 360, the semiconductor spacer 365, and the semiconductor layer 370 as discussed in FIG. 17. The channel structure CH1 may also include the stack of the semiconductor layer 460, the semiconductor spacer 465, and the semiconductor layer 470 as discussed in FIG. 18. The channel structure CH1 may also include the stack of strain relaxed buffer layer 555, the semiconductor layer 560, the semiconductor spacer 565, and the semiconductor layer 570 as discussed in FIG. 19.

FIG. 20B illustrates a fin-type memory device. The fin-type memory device includes a substrate ST2, a fin structure F2 protruding from a top surface of the substrate ST2, a gate structure G2 crossing the fin structure F2 and covering at least three sides of the fin structure F2. In greater details, the gate structure G2 covers a channel region CH2 of the fin structure F2. In some embodiments, the fin structure F2 may include source/drain structures SD2 on opposite sides of the gate structure G2. The source/drain structures SD2 may be doped regions in fin structure F2, the source/drain structures SD2 may also be epitaxy structures in the fin structure F2. In some embodiments, the gate structure G2 may include materials of the gate structure 80 as discussed in FIG. 1, such as a gate dielectric 82, an adhesion metal 83, and a gate electrode 84.

In some embodiments, the fin structure F2 (as well as the channel region CH2) may include the stack of strain relaxed buffer layer 55, the semiconductor layer 60 the semiconductor spacer 65, and the semiconductor layer 70 as discussed in FIG. 1. The fin structure F2 (as well as the channel region CH2) may also include the stack of strain relaxed buffer layer 55, the semiconductor layer 260, the semiconductor spacer 65, and the semiconductor layer 270 as discussed in FIG. 16. The fin structure F2 (as well as the channel region CH2) may also include the stack of strain relaxed buffer layer 355, the semiconductor layer 360, the semiconductor spacer 365, and the semiconductor layer 370 as discussed in FIG. 17. The fin structure F2 (as well as the channel region CH2) may also include the stack of the semiconductor layer 460, the semiconductor spacer 465, and the semiconductor layer 470 as discussed in FIG. 18. The fin structure F2 (as well as the channel region CH2) may also include the stack of strain relaxed buffer layer 555, the semiconductor layer 560, the semiconductor spacer 565, and the semiconductor layer 570 as discussed in FIG. 19.

FIG. 20C illustrates a horizontally stacked nanowire memory device. The horizontally stacked nanowire memory device include a substrate ST3, a plurality of nanowires NW3, a gate structure G3 wrapping around each of the nanowires NW3, and source/drain structures SD3 wrapping around each of the nanowires NW3 and on opposite sides of the gate structure G3. The nanowires NW3 may include longitudinal axis parallel to a top surface of the substrate ST3, and are horizontally arranged over the substrate ST3. In some embodiments, the source/drain structures SD3 may be epitaxy structures. In some embodiments, the gate structure G3 may include materials of the gate structure 80 as discussed in FIG. 1, such as a gate dielectric 82, an adhesion metal 83, and a gate electrode 84.

In some embodiments, each nanowire NW3 may include the stack of strain relaxed buffer layer 55, the semiconductor layer 60, the semiconductor spacer 65, and the semiconductor layer 70 as discussed in FIG. 1. Each nanowire NW3 may also include the stack of strain relaxed buffer layer 55, the semiconductor layer 260, the semiconductor spacer 65, and the semiconductor layer 270 as discussed in FIG. 16. Each nanowire NW3 may also include the stack of strain relaxed buffer layer 355, the semiconductor layer 360, the semiconductor spacer 365, and the semiconductor layer 370 as discussed in FIG. 17. Each nanowire NW3 may also include the stack of the semiconductor layer 460, the semiconductor spacer 465, and the semiconductor layer 470 as discussed in FIG. 18. Each nanowire NW3 may also include the stack of strain relaxed buffer layer 555, the semiconductor layer 560, the semiconductor spacer 565, and the semiconductor layer 570 as discussed in FIG. 19.

Figure 20E:
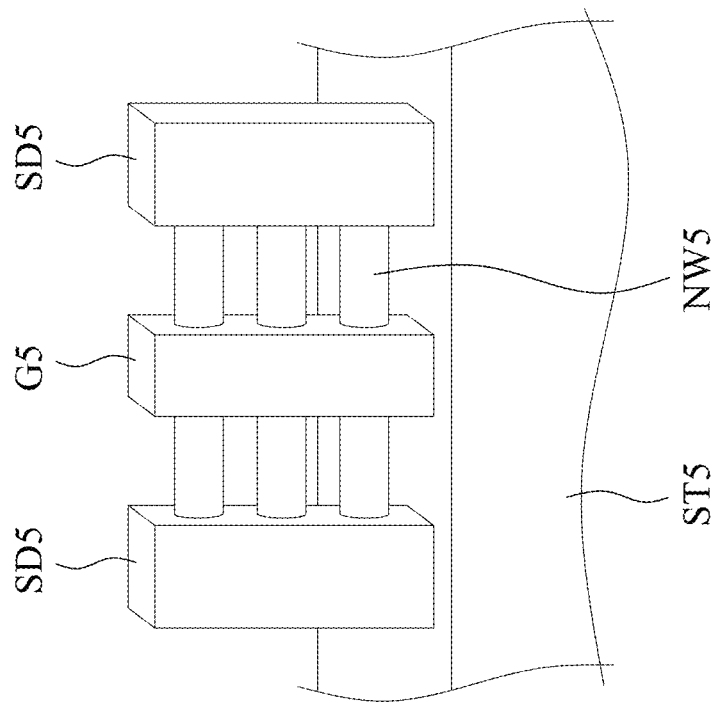
Figure 20D:
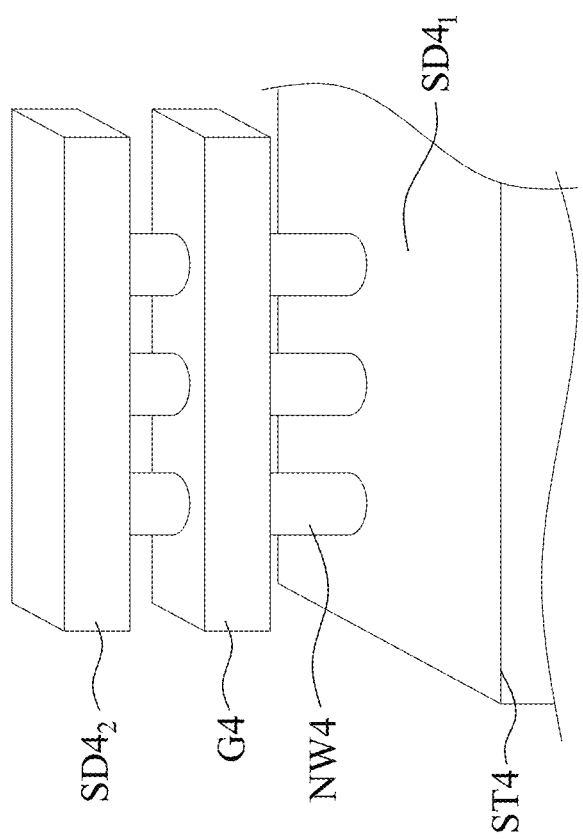

FIG. 20D illustrates a vertical nanowire memory device. The horizontally stacked nanowire memory device include a substrate ST4, a plurality of nanowires NW4, a gate structure G4 wrapping around each of the nanowires NW4, a source/drain structures $SD4_1$ and a source/drain structures $SD4_2$ wrapping around each of the nanowires NW4 and on opposite sides of the gate structure G4. The nanowires NW4 may include longitudinal axis vertical to a top surface of the substrate ST4, and are horizontally arranged over the substrate ST4. In some embodiments, the source/drain structures $SD4_1$ may be a doped region in the substrate ST4, or may be and epitaxy structure over the substrate ST4. The source/drain structures $SD4_2$ may be epitaxy structure. In some embodiments, the gate structure G4 may include materials of the gate structure 80 as discussed in FIG. 1, such as a gate dielectric 82, an adhesion metal 83, and a gate electrode 84.

In some embodiments, each nanowire NW4 may include the stack of strain relaxed buffer layer 55, the semiconductor layer 60, the semiconductor spacer 65, and the semiconductor layer 70 as discussed in FIG. 1. Each nanowire NW4 may also include the stack of strain relaxed buffer layer 55, the semiconductor layer 260, the semiconductor spacer 65, and the semiconductor layer 270 as discussed in FIG. 16. Each nanowire NW4 may also include the stack of strain relaxed buffer layer 355, the semiconductor layer 360, the semiconductor spacer 365, and the semiconductor layer 370 as discussed in FIG. 17. Each nanowire NW4 may also include the stack of the semiconductor layer 460, the semiconductor spacer 465, and the semiconductor layer 470 as discussed in FIG. 18. Each nanowire NW4 may also include the stack of strain relaxed buffer layer 555, the semiconductor layer 560, the semiconductor spacer 565, and the semiconductor layer 570 as discussed in FIG. 19.

FIG. 20E illustrates a vertically stacked nanowire memory device. The vertically stacked nanowire memory device include a substrate ST5, a plurality of nanowires NW5, a gate structure G5 wrapping around each of the nanowires NW5, and source/drain structures SD5 wrapping around each of the nanowires NW5 and on opposite sides of the gate structure G5. The nanowires NW5 may include longitudinal axis parallel to a top surface of the substrate ST5, and are vertically stacked on each over the substrate ST5. In some embodiments, the source/drain structures SD5 may be epitaxy structures. In some embodiments, the gate structure G5 may include materials of the gate structure 80 as discussed in FIG. 1, such as a gate dielectric 82, an adhesion metal 83, and a gate electrode 84.

In some embodiments, each nanowire NW5 may include the stack of strain relaxed buffer layer 55, the semiconductor layer 60, the semiconductor spacer 65, and the semiconductor layer 70 as discussed in FIG. 1. Each nanowire NW5 may also include the stack of strain relaxed buffer layer 55, the semiconductor layer 260, the semiconductor spacer 65, and the semiconductor layer 270 as discussed in FIG. 16. Each nanowire NW5 may also include the stack of strain relaxed buffer layer 355, the semiconductor layer 360, the semiconductor spacer 365, and the semiconductor layer 370 as discussed in FIG. 17. Each nanowire NW5 may also include the stack of the semiconductor layer 460, the semiconductor spacer 465, and the semiconductor layer 470 as discussed in FIG. 18. Each nanowire NW5 may also include the stack of strain relaxed buffer layer 555, the semiconductor layer 560, the semiconductor spacer 565, and the semiconductor layer 570 as discussed in FIG. 19.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that a novel flash memory device is provided using Si/SiGe heterostructure. Furthermore, another advantage is that the novel flash memory device can be integrated with logic device and quantum device on the same material platform, enabling quantum systems on a chip (QSOC) device. This can further enable cost- and performance-effective large-scale quantum computers, and will reduce the wiring complexity, heating, and latency. Another advantage is that the carriers tunneling through the crystal SiGe layer suppressing the oxide breakdown and resulting in high endurance with a single oxide layer deposition required, simplifying the fabrication process. Yet another advantage is that the device can be operated over 10000 times without memory window degradation. The device has retention (over 10000s) with a greater threshold window. The device can further be operated under temperature from about 4K to about 120K (over 10000 times) without memory window degradation.

In some embodiments of the present disclosure, a flash memory device includes a substrate, a semiconductor quantum well layer, a semiconductor spacer, a semiconductor channel layer, a gate structure, and source/drain regions. The semiconductor quantum well layer is formed of a first semiconductor material and is disposed over the substrate. The semiconductor spacer is formed of a second semiconductor material and is disposed over the first semiconductor channel layer. The semiconductor channel layer is formed of the first semiconductor material and is disposed over the semiconductor spacer. Thea gate structure is over the second semiconductor channel layer. The source/drain regions are over the substrate and are on opposite sides of the gate structure. In some embodiments, the semiconductor spacer is thicker than the semiconductor quantum well layer and the semiconductor channel layer. In some embodiments, a germanium atomic percentage of the semiconductor spacer is higher than a germanium atomic percentage of the semiconductor quantum well layer and a germanium atomic percentage of the semiconductor channel layer. In some embodiments, the flash memory device further includes a strain relaxed buffer layer between the semiconductor quantum well layer and the substrate. In some embodiments, the strain relaxed buffer layer is formed of the second semiconductor material. In some embodiments, the semiconductor quantum well layer, the semiconductor spacer, and the semiconductor channel layer are un-doped. In some embodiments, in a program operation of the flash memory device, a drain current increases when a gate voltage applied to the gate structure increases from a first level to a second level, the drain current is saturated when the gate voltage applied to the gate structure increases from the second level to a third level, and the drain current decreases when the gate voltage applied to the gate structure increases from the third level to a fourth level. In some embodiments, a voltage for programming the flash memory device is a positive voltage, and a voltage for erasing the flash memory device is a negative voltage. In some embodiments, an absolute value of a minimum voltage for programming the flash memory device is lower than an absolute value of a maximum voltage for erasing the flash memory device.

In some embodiments of the present disclosure, an integrated circuit includes a substrate, a flash memory device over a first region of the substrate, and a gate-defined quantum dot device over a second region of the substrate. The flash memory device includes a first portion of a first semiconductor layer over the substrate; a first portion of a semiconductor spacer over the first semiconductor layer; a first portion of a second semiconductor layer over the semiconductor spacer; first source/drain regions over the substrate; and a first gate structure over the second semiconductor layer and between the first source/drain regions. The gate-defined quantum dot device includes a second portion of the first semiconductor layer over the substrate; a second portion of the semiconductor spacer over the first semiconductor layer; a second portion of the second semiconductor layer over the semiconductor spacer; second source/drain regions over the substrate; and a second gate structure and a third gate structure over the second semiconductor layer, wherein the second gate structure and the third gate structure are between the second source/drain regions. In some embodiments, the integrated circuit further includes a strain relaxed buffer layer between the substrate and the first semiconductor layer. In some embodiments, bottom surfaces of the first source/drain regions are lower than a top surface of the strain relaxed buffer layer and are higher than a bottom surface of the strain relaxed buffer layer. In some embodiments, the second and third gate structures have separated gate metals but a shared gate dielectric. In some embodiments, a germanium atomic percentage of the semiconductor spacer is higher than a germanium atomic percentage of the first semiconductor layer and a germanium atomic percentage of the second semiconductor layer. In some embodiments, the semiconductor spacer is thicker than the first semiconductor layer and the second semiconductor layer, and the first semiconductor layer is thicker than the second semiconductor layer.

In some embodiments of the present disclosure, a method includes performing a program operation to write a data in a flash memory device, the flash memory device comprising: a substrate; a semiconductor quantum well layer over the substrate; a semiconductor spacer over the semiconductor quantum well layer; a semiconductor channel layer over the semiconductor spacer; a gate structure over the semiconductor channel layer; and source/drain regions over the substrate and on opposite sides of the gate structure, wherein the program operation is performed such that a threshold voltage of the flash memory device increases from a first level to a second level; and performing an erase operation to erase the data from the flash memory device, wherein the erase operation is performed such that the threshold voltage of the flash memory device decreases from the second level back to the first level. In some embodiments, during the program operation a drain current increases when a gate voltage applied to the gate structure increases from the first voltage to the second voltage, the drain current is saturated when the gate voltage applied to the gate structure increases from the second voltage to a third voltage, and the drain current decreases when the gate voltage applied to the gate structure increases from the third voltage to a fourth voltage. In some embodiments, an absolute value of a minimum voltage for the program operation is lower than an absolute value of a maximum voltage for the erase operation. In some embodiments, a voltage for the program operation is a positive voltage, and a voltage for the erase operation is a negative voltage. In some embodiments, the method further includes performing a read operation to the flash memory device, wherein a gate voltage applied to the gate structure during the read operation is between the first level and the second level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    performing a program operation to write a data in a flash memory device comprising a semiconductor quantum well layer, a semiconductor spacer over the semiconductor quantum well layer, a semiconductor channel layer over the semiconductor spacer, and a gate structure over the semiconductor channel layer, wherein the program operation is performed by supplying a forward sweep voltage to the gate structure, to increase a threshold voltage of the flash memory device from a first level to a second level; and
    performing an erase operation to erase the data from the flash memory device, wherein the erase operation is performed by supplying a backward sweep voltage to the gate structure, to decrease the threshold voltage of the flash memory device from the second level back to the first level.

2. The method of claim 1, wherein during the program operation
    a drain current increases when a gate voltage applied to the gate structure increases from a first voltage to a second voltage,
    the drain current is saturated when the gate voltage applied to the gate structure increases from the second voltage to a third voltage, and
    the drain current decreases when the gate voltage applied to the gate structure increases from the third voltage to a fourth voltage.

3. The method of claim 1, wherein an absolute value of a minimum voltage for the program operation is lower than an absolute value of a maximum voltage for the erase operation.

4. The method of claim 1, wherein a voltage for the program operation is a positive voltage, and a voltage for the erase operation is a negative voltage.

5. The method of claim 1, further comprising performing a read operation to the flash memory device, wherein a gate voltage applied to the gate structure during the read operation is between the first level and the second level.

6. The method of claim 1, wherein,
    during the program operation, carriers are trapped at an interface between a gate dielectric of the gate structure and the semiconductor channel layer, resulting in the threshold voltage of the flash memory device increasing from the first level to the second level, and
    during the erase operation, the carriers are de-trapped from the interface between the gate dielectric of the gate structure and the semiconductor channel layer, resulting in the threshold voltage of the flash memory device decreasing from the second level back to the first level.

7. The method of claim 1, wherein supplying the forward sweep voltage to the gate structure comprises:
    at a first stage, increasing the gate voltage from a first level to a third level, such that a drain current of the flash memory device increases, wherein during the first stage, carriers are injected into the semiconductor quantum well layer;
    at a second stage, increasing the gate voltage from the third level to a fourth level, such that the drain current saturates, wherein during the second stage, the carriers tunnel from the semiconductor quantum well layer to the semiconductor channel layer through the semiconductor spacer and are trapped at an interface between a gate dielectric of the gate structure and the semiconductor channel layer;
    at a third stage, increasing the gate voltage from the fourth level to a fifth level, such that the drain current decreases, wherein during the third stage, the carriers are injected into the semiconductor channel layer;
    at a fourth stage, increasing the gate voltage from the fifth level to a sixth level, such that the drain current increases to a constant value; and
    at a fifth stage, decreasing the gate voltage from the sixth level to the second level, such that the drain current is pinched off, wherein during the fifth stage, the carriers in the semiconductor channel layer and the semiconductor quantum well layer are depleted.

8. A method, comprising:
    performing a program operation to write a data in a flash memory device comprising a semiconductor quantum well layer formed of a first semiconductor material, a semiconductor spacer formed of a second semiconductor material over the semiconductor quantum well layer, a semiconductor channel layer formed of the first semiconductor material over the semiconductor spacer, and a gate structure over the semiconductor channel layer, wherein the program operation is performed by supplying a forward sweep voltage to the gate structure, to increase a threshold voltage of the flash memory device from a first level to a second level; and
    performing an erase operation to erase the data from the flash memory device, wherein the erase operation is performed by supplying a backward sweep voltage to the gate structure, to decrease the threshold voltage of the flash memory device decreases from the second level back to the first level.

9. The method of claim 8, wherein the semiconductor spacer is thicker than the semiconductor quantum well layer and the semiconductor channel layer.

10. The method of claim 8, wherein a germanium atomic percentage of the semiconductor spacer is higher than a germanium atomic percentage of the semiconductor quantum well layer and a germanium atomic percentage of the semiconductor channel layer.

11. The method of claim 8, wherein the flash memory device further comprises a strain relaxed buffer layer between the semiconductor quantum well layer and a substrate.

12. The method of claim 11, wherein the strain relaxed buffer layer is formed of the second semiconductor material.

13. The method of claim 8, wherein the semiconductor quantum well layer, the semiconductor spacer, and the semiconductor channel layer are un-doped.

14. The method of claim 8, wherein in the program operation of the flash memory device,
   a drain current increases when a gate voltage applied to the gate structure increases from a first voltage to a second voltage,
   the drain current is saturated when the gate voltage applied to the gate structure increases from the second voltage to a third voltage, and
   the drain current decreases when the gate voltage applied to the gate structure increases from the third voltage to a fourth voltage.

15. The method of claim 8, wherein a voltage for programming the flash memory device is a positive voltage, and a voltage for erasing the flash memory device is a negative voltage.

16. The method of claim 8, wherein an absolute value of a minimum voltage for programming the flash memory device is lower than an absolute value of a maximum voltage for erasing the flash memory device.

17. A method, comprising:
   performing a program operation to write a data in a flash memory device comprising a silicon quantum well layer, a silicon germanium spacer over the silicon quantum well layer, a silicon channel layer over the silicon germanium spacer, and a gate structure over the silicon channel layer, wherein the program operation is performed by supplying a forward sweep voltage to the gate structure, to increase a threshold voltage of the flash memory device increases from a first level to a second level;
   performing an erase operation to erase the data from the flash memory device, wherein the erase operation is performed by supplying a backward sweep voltage to the gate structure, to decrease the threshold voltage of the flash memory device decreases from the second level back to the first level.

18. The method of claim 17, wherein during the program operation
   a drain current increases when a gate voltage applied to the gate structure increases from a first voltage to a second voltage,
   the drain current is saturated when the gate voltage applied to the gate structure increases from the second voltage to a third voltage, and
   the drain current decreases when the gate voltage applied to the gate structure increases from the third voltage to a fourth voltage.

19. The method of claim 18, wherein the drain current saturates when the gate voltage applied to the gate structure increases from the fourth voltage to a fifth voltage.

20. The method of claim 17, wherein an absolute value of a minimum voltage for the program operation is lower than an absolute value of a maximum voltage for the erase operation.

* * * * *